United States Patent
Cao et al.

(10) Patent No.: US 12,549,144 B2
(45) Date of Patent: Feb. 10, 2026

(54) INTERSTAGE MATCHING CIRCUIT AND PUSH-PULL POWER AMPLIFIER CIRCUIT

(71) Applicant: RadRock (Chongqing) Tech Co., Ltd., Chongqing (CN)

(72) Inventors: Yuan Cao, Guangdong (CN); Xinghua Rong, Guangdong (CN); Xiaolei Lai, Guangdong (CN); Chuanqiu Lei, Guangdong (CN); Jianxing Ni, Guangdong (CN)

(73) Assignee: RadRock (Chongqing) Tech Co., Ltd., Chongqing (CN)

( * ) Notice: Subject to any disclaimer, the term of this patent is extended or adjusted under 35 U.S.C. 154(b) by 783 days.

(21) Appl. No.: 17/797,719

(22) PCT Filed: Oct. 26, 2021

(86) PCT No.: PCT/CN2021/126284
§ 371 (c)(1),
(2) Date: Aug. 4, 2022

(87) PCT Pub. No.: WO2022/116741
PCT Pub. Date: Jun. 9, 2022

(65) Prior Publication Data
US 2023/0062918 A1  Mar. 2, 2023

(30) Foreign Application Priority Data
Dec. 1, 2020  (CN) .......................... 202011382662.1

(51) Int. Cl.
*H03F 3/26* (2006.01)
*H03F 1/42* (2006.01)
(Continued)

(52) U.S. Cl.
CPC ................. *H03F 3/26* (2013.01); *H03F 1/42* (2013.01); *H03F 1/565* (2013.01); *H03F 3/19* (2013.01);
(Continued)

(58) Field of Classification Search
CPC ... H03F 3/26; H03F 1/42; H03F 1/565; H03F 3/19; H03F 2200/267; H03F 2200/318; H03F 2200/451
(Continued)

(56) References Cited

U.S. PATENT DOCUMENTS 7,227,427 B2 * 6/2007 Kawanami ............. H01P 1/387
333/1.1
7,345,537 B2 * 3/2008 Apel ...................... H03F 1/0244
330/133
2018/0241350 A1   8/2018 Leipold et al.

FOREIGN PATENT DOCUMENTS

| CN | 1371545 A | 9/2002 |
| CN | 1759499 A | 4/2006 |

(Continued)

OTHER PUBLICATIONS

International Search Report of PCT Patent Application No. PCT/CN2021/126284 issued on Jan. 26, 2022.

*Primary Examiner* — Andrea Lindgren Baltzell
*Assistant Examiner* — Khiem D Nguyen

(57) ABSTRACT

Provided are an interstage matching circuit and a push-pull power amplifier circuit. The push-pull power amplifier circuit comprises a pre-stage push-pull amplifier circuit and a post-stage push-pull amplifier circuit. The interstage matching circuit comprises a first matching capacitor connected in series between the pre-stage push-pull amplifier circuit and the post-stage push-pull amplifier circuit; and a second matching capacitor connected in series between the pre-stage push-pull amplifier circuit and the post-stage push-pull
(Continued)

amplifier circuit; a first matching inductor is connected with a connection node between the pre-stage push-pull amplifier circuit and the first matching capacitor, the first matching inductor is connected with a second matching inductor, the second matching inductor is connected with a connection node between the pre-stage push-pull amplifier circuit and the second matching capacitor, and a connection node between the first matching inductor and the second matching inductor is used for connecting with a feed power supply.

12 Claims, 10 Drawing Sheets

(51) Int. Cl.
*H03F 1/56* (2006.01)
*H03F 3/19* (2006.01)

(52) U.S. Cl.
CPC .. *H03F 2200/267* (2013.01); *H03F 2200/318* (2013.01); *H03F 2200/451* (2013.01)

(58) Field of Classification Search
USPC ...................................... 330/157, 124 R, 295
See application file for complete search history.

(56) References Cited

FOREIGN PATENT DOCUMENTS

| | | |
|---|---|---|
| CN | 102484464 A | 5/2012 |
| CN | 102594288 A | 7/2012 |
| CN | 103066932 A | 4/2013 |

\* cited by examiner

INTERSTAGE MATCHING CIRCUIT AND PUSH-PULL POWER AMPLIFIER CIRCUIT

This application claims the priority of Chinese Patent Application No. 202011382662.1, filed on Dec. 1, 2020, titled "Interstage matching circuit and push-pull power amplifier circuit", the contents of which are incorporated herein by reference in their entirety.

TECHNICAL FIELD

The application relates to the technical field of radio frequency (RF) circuit, in particular to an interstage matching circuit and a push-pull power amplifier circuit.

BACKGROUND

Push-pull power amplifier circuit is the core radio frequency unit in communication system, and its performance characteristics have a great influence on the whole system index, especially its frequency and bandwidth characteristics, which affect the transmission capacity of communication system. At present, in the practical application process, the push-pull power amplifier circuit requires a wider working frequency band, so as to support wider broadband signals. However, due to its own device characteristics, the frequency and bandwidth of the existing push-pull power amplifier circuit are limited by devices and applications, which makes it unable to meet the demand of supporting wider broadband signals.

SUMMARY

The embodiments of the application provide an interstage matching circuit and a push-pull power amplifier circuit, aiming to solve the problem that the existing push-pull power amplifier circuit cannot meet the requirement of supporting signals with wider frequency bands to pass through.

The present application provides an interstage matching circuit, configured to perform impedance matching for a push-pull power amplifier circuit, the push-pull power amplifier circuit includes a pre-stage push-pull amplifier circuit and a post-stage push-pull amplifier circuit; the interstage matching circuit includes a primary matching circuit, the primary matching circuit includes a first matching capacitor, a second matching capacitor, a first matching inductor and a second matching inductor;

the first matching capacitor is connected in series between a first output end of the pre-stage push-pull amplifier circuit and a first input end of the post-stage push-pull amplifier circuit;
the second matching capacitor is connected in series between a second output end of the pre-stage push-pull amplifier circuit and a second input end of the post-stage push-pull amplifier circuit;
a first end of the first matching inductor is connected with a connection node between the first output end of the pre-stage push-pull amplifier circuit and the first matching capacitor, a second end of the first matching inductor is connected with a first end of the second matching inductor, a second end of the second matching inductor is connected with a connection node between the second output end of the pre-stage push-pull amplifier circuit and the second matching capacitor, and a connection node between the first matching inductor and the second matching inductor is used for connecting with a feed power supply.

The present application also provides a push-pull power amplifier circuit, including a pre-stage push-pull amplifier circuit and a post-stage push-pull amplifier circuit, further including an interstage matching circuit, configured to perform impedance matching for the push-pull power amplifier circuit, the push-pull power amplifier circuit includes a pre-stage push-pull amplifier circuit and a post-stage push-pull amplifier circuit; and the interstage matching circuit includes a primary matching circuit, the primary matching circuit includes a first matching capacitor, a second matching capacitor, a first matching inductor and a second matching inductor;

the first matching capacitor is connected in series between a first output end of the pre-stage push-pull amplifier circuit and a first input end of the post-stage push-pull amplifier circuit;
the second matching capacitor is connected in series between a second output end of the pre-stage push-pull amplifier circuit and a second input end of the post-stage push-pull amplifier circuit;
a first end of the first matching inductor is connected with a connection node between the first output end of the pre-stage push-pull amplifier circuit and the first matching capacitor, a second end of the first matching inductor is connected with a first end of the second matching inductor, a second end of the second matching inductor is connected with a connection node between the second output end of the pre-stage push-pull amplifier circuit and the second matching capacitor, and a connection node between the first matching inductor and the second matching inductor is used for connecting with a feed power supply.

The present application further provides a push-pull power amplifier circuit, including a pre-stage push-pull amplifier circuit, a post-stage push-pull amplifier circuit and an interstage matching circuit, the interstage matching circuit is configured to perform impedance matching for the push-pull power amplifier circuit;

the post-stage push-pull amplifier circuit includes a first post-amplifier unit and a second post-amplifier unit;
the first post-amplifier unit includes at least two first power amplification units connected in parallel between an input node and an output node of the first post-amplifier unit; the first power amplification unit includes a first DC blocking capacitor and a first amplification transistor, the first DC blocking capacitor is connected between the input node of the first post-amplifier unit and an input end of the first amplification transistor;
the second post-amplifier unit includes at least two second power amplification units connected in parallel between an input node and an output node of the second post-amplifier unit; the second power amplification unit includes a second DC blocking capacitor and a second amplification transistor, the second DC blocking capacitor is connected between the input node of the second post-amplifier unit and an input end of the second amplification transistor;
the interstage matching circuit includes a primary matching circuit, the primary matching circuit includes a first matching inductor and a second matching inductor; and
a first end of the first matching inductor is connected with the input node of the first post-amplifier unit, a second end of the first matching inductor is connected with the first end of the second matching inductor, a second end of the second matching inductor is connected with the input node of the second post-amplifier unit, and a connection node between the first matching inductor and the second matching inductor is used for connecting with a feed power supply.

The present application further provides a push-pull power amplifier circuit, including a pre-stage push-pull amplifier circuit, a post-stage push-pull amplifier circuit and an interstage matching circuit, the interstage matching circuit is configured to perform impedance matching for the push-pull power amplifier circuit;

the post-stage push-pull amplifier circuit includes a first post-amplifier unit and a second post-amplifier unit, the first post-amplifier unit includes at least two first power amplification units connected in parallel between an input node and an output node of the first post-amplifier unit; the first power amplification unit includes a first DC blocking capacitor and a first amplification transistor, the first DC blocking capacitor is connected between the input node of the first post-amplifier unit and an input end of the first amplification transistor;

the second post-amplifier unit includes at least two second power amplification units connected in parallel between an input node and an output node of the second post-amplifier unit; the second power amplification unit includes a second DC blocking capacitor and a second amplification transistor, the second DC blocking capacitor is connected between the input node of the second post-amplifier unit and an input end of the second amplification transistor;

the interstage matching circuit includes a primary matching circuit and a post-matching circuit, and the post-matching circuit is arranged between the primary matching circuit and the post-stage push-pull amplifier circuit;

the primary matching circuit includes a first matching capacitor, a second matching capacitor, a first matching inductor and a second matching inductor;

the first matching capacitor is connected in series between a first output end of the pre-stage push-pull amplifier circuit and a first input end of the post-stage push-pull amplifier circuit;

the second matching capacitor is connected in series between a second output end of the pre-stage push-pull amplifier circuit and a second input end of the post-stage push-pull amplifier circuit;

a first end of the first matching inductor is connected with a connection node between the first output end of the pre-stage push-pull amplifier circuit and the first matching capacitor, a second end of the first matching inductor is connected with a first end of the second matching inductor, a second end of the second matching inductor is connected with a connection node between the second output end of the pre-stage push-pull amplifier circuit and the second matching capacitor, and a connection node between the first matching inductor and the second matching inductor is used for connecting with a feed power supply;

the post-matching circuit includes a third matching inductor and a fourth matching inductor;

a first end of the third matching inductor is connected with a connection node between the first matching capacitor and the input node of the first post-amplifier unit, a second end of the third matching inductor is connected with a first end of the fourth matching inductor, and a second end of the fourth matching inductor is connected with a connection node between the second matching capacitor and the input node of the second post-amplifier unit; and a connection node between the third matching inductor and the fourth matching inductor is connected with a ground end.

In the above interstage matching circuit and push-pull power amplifier circuit, the first matching inductor and the first matching capacitor construct an LC matching network, used for performing impedance matching for a first branch formed between the first output end of the pre-stage push-pull amplifier circuit and the first input end of the post-stage push-pull amplifier circuit. Accordingly, the second matching inductor and the second matching capacitor construct another LC matching network, used for performing impedance matching for a second branch formed between the second output end of the pre-stage push-pull amplifier circuit and the second input end of the post-stage push-pull amplifier circuit. In this embodiment, two LC matching networks are formed between the pre-stage push-pull amplifier circuit and the post-stage push-pull amplifier circuit, so that the pre-stage push-pull amplifier circuit can perform first-stage amplification processing on the received RF signal to form two first-stage amplified RF signals. The two first-stage amplified RF signals are respectively subjected to impedance matching through the LC matching network, and then are respectively input into a post-stage push-pull amplifier circuit for second-stage amplification processing to form two second-stage amplified RF signals, and the two LC matching networks formed by the primary matching circuit are used for impedance matching. It is helpful to improve the overall bandwidth between the pre-stage push-pull amplifier circuit and the post-stage push-pull amplifier circuit, so as to support signals with wider bands to pass through.

BRIEF DESCRIPTION OF DRAWINGS

In order to explain the technical solution of the embodiments of this application more clearly, the drawings described in the description of the embodiments of this application will be briefly introduced below. Obviously, the drawings in the present application and their accompanying detailed description are directed to merely exemplary embodiments of the application. For those of ordinary skill in this field, other drawings may be obtained according to these drawings without any creative effort.

Figure 1:
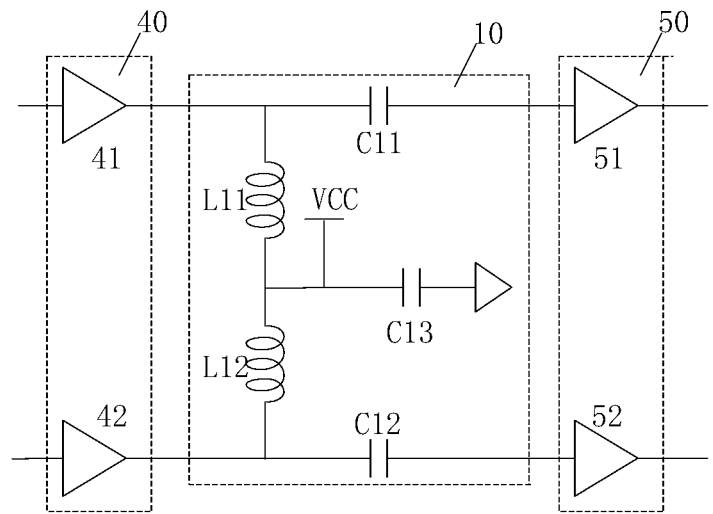
FIG. 1 is a schematic circuit diagram of an interstage matching circuit provided by an embodiment of the present application.

The reference signs in the drawings are as follows:
10. Primary matching circuit; C11. First matching capacitor; C12. Second matching capacitor; L11. First matching inductor; L12. Second matching inductor; C13. Decoupling capacitor; VCC. Feed power supply; C14. First adjusting capacitor; C15. Second adjusting capacitor; 20. Post-matching circuit; C21. Third matching capacitor; C22. Fourth matching capacitor; L21. Third matching inductor; L22. Fourth matching inductor; 30. Pre-matching circuit; L31. Fifth matching inductor; L32. Sixth matching inductor; C31. Fifth matching capacitor; C32. Sixth matching capacitor; 40. Pre-stage push-pull amplifier circuit; 41. First pre-amplifier unit; 42. Second pre-amplifier unit; 50. Post-stage push-pull amplifier circuit; 51. First post-amplifier unit; 52. Second post-amplifier unit.

DETAILED DESCRIPTION OF DISCLOSED EMBODIMENTS

The technical solutions in the embodiments of the present application will be clearly and completely described below with reference to the drawings in the embodiments of this application. Obviously, the described embodiments are part of the embodiments of this application, but not all of them. Based on the embodiments in this application, all other embodiments obtained by those of ordinary skill in the art without creative effort belong to the protection scope of this application.

It should be understood that the exemplary embodiments may be embodied in many different forms and should not be construed as being limited to the exemplary embodiments set forth herein. Rather, these embodiments are provided so that this disclosure will be thorough and complete, and will fully convey the protection scope of this application to those skilled in the art.

In the drawings, like reference signs refer to like elements throughout, and the size and relative sizes of layers and regions may be exaggerated for clarity.

It should be understood that when an element or layer is referred to as being "on", "adjacent to", "connected with" or "coupled to" other elements or layers, it may be directly on, adjacent to, connected with or coupled to other elements or layers, or intervening elements or layers.

Rather, when an element is referred to as being "directly on", "directly adjacent to", "directly connected with" or "directly coupled to" other elements or layers, there is no intervening element or layer. It should be understood that although the terms first, second, third, etc. are used to describe various elements, components, areas, layers and/or parts, these elements, components, areas, layers and/or parts should not be limited by these terms. These terms are only used to distinguish one element, part, area, layer or part from another element, part, area, layer or part. Therefore, without departing from the teachings of this application, the first element, part, area, layer or part discussed below may be represented as the second element, part, area, layer or part.

Spatial terms such as "below", "under", "above" and "on" may be used here for convenience of description to describe the relationship between one element or feature and other elements or features shown in the figures. It should be understood that in addition to the orientations shown in the figures, the spatial relationship terms are intended to include different orientations of devices in use and operation. For example, if the device in the figures is turned upside down, then the elements or features described as "below" or "under" other elements or features would be "above" or "on" other elements or features. Therefore, the exemplary terms "below" or "under" may include the orientations of "above" or "on". The device may be otherwise oriented (rotated by 90 degrees or other orientations) and the spatial description terms used here are interpreted accordingly.

The terms used here are only for the purpose of describing specific embodiments and not as a limitation of the present application. As used herein, singular forms of "a", "an" and "the/said" are also intended to include plural forms, unless the context clearly indicates otherwise. It should also be understood that the terms "comprise" and/or "composed of" used in this specification specify the presence of said features, integers, steps, operations, elements and/or components, but do not exclude the presence or addition of one or more other features, integers, steps, operations, elements, components and/or groups. As used herein, the term "and/or" includes any and all combinations of related listed items.

For a thorough understanding of this application, detailed structures and steps will be set forth in the following description, so as to illustrate the technical solution proposed in the present application. The preferred embodiments of the present application are described in detail as follows, but besides these detailed descriptions, the present application may also have other embodiments.

The embodiment of the application provides an interstage matching circuit, configured to perform impedance matching for a push-pull power amplifier circuit, the push-pull power amplifier circuit includes a pre-stage push-pull amplifier circuit 40 and a post-stage push-pull amplifier circuit 50. As shown in FIG. 1, the interstage matching circuit includes a primary matching circuit 10, the primary matching circuit 10 includes a first matching capacitor C11, a second matching capacitor C12, a first matching inductor L11 and a second matching inductor L12; the first matching capacitor C11 is arranged in series between a first output end of the pre-stage push-pull amplifier circuit 40 and a first input end of the post-stage push-pull amplifier circuit 50; the second matching capacitor C12 is arranged in series between a second output end of pre-stage push-pull amplifier circuit 40 and a second input end of post-stage push-pull amplifier circuit 50; a first end of the first matching inductor L11 is connected to the connection node between the first output end of the pre-stage push-pull amplifier circuit 40 and the first matching capacitor C11, a second end of the first matching inductor L11 is connected with a first end of the second matching inductor L12, a second end of the second matching inductor L12 is connected to the connection node between the second output end of the pre-stage push-pull amplifier circuit 40 and the second matching capacitor C12, and the connection node between the first matching inductor L11 and the second matching inductor L12 is used to connect with a feed power supply VCC.

The feed power supply VCC is an external power supply for feeding the interstage matching circuit. In this embodiment, the first matching capacitor C11 is arranged between the first output end of the pre-stage push-pull amplifier circuit 40 and the first input end of the post-stage push-pull amplifier circuit 50, the second matching capacitor C12 is provided between the second output end of the pre-stage push-pull amplifier circuit 40 and the second input of post-stage push-pull amplifier circuit 50. With the DC blocking property of the first matching capacitor C11 and the second matching capacitor C12, the DC current is blocked from being transmitted between the pre-stage push-pull amplifier circuit 40 and the post-stage push-pull amplifier circuit 50, so that the pre-stage push-pull amplifier circuit 40 and the post-stage push-pull amplifier circuit 50 can work statically and properly without affecting each other.
Because of the DC blocking property of the first matching capacitor C11 and the second matching capacitor C12, it is necessary to connect the feed power supply VCC to the interstage matching circuit, such that the feed power supply VCC can feed the pre-stage push-pull amplifier circuit 40 through the first matching inductor L11 and the second matching inductor L12, respectively, thus the pre-stage push-pull amplifier circuit 40 can realize power amplification function.

Further, in order to ensure that the feed power supply VCC can conduct a stable power supply, and reduce the noise coupled to the feed power supply VCC by the first matching inductor L11 and the second matching inductor L12, the primary matching circuit 10 is further provided with a decoupling capacitor C13, one end of the decoupling capacitor C13 is connected to the connection node between the first matching inductor L11 and the second matching inductor L12, and the other end is connected to the ground end.

Understandably, the first matching inductor L11 and the first matching capacitor C11 construct an LC matching network, used for performing impedance matching for a first branch formed between the first output end of the pre-stage push-pull amplifier circuit 40 and the first input end of the post-stage push-pull amplifier circuit 50. Accordingly, the second matching inductor L12 and the second matching capacitor C12 construct another LC matching network, used for performing impedance matching for a second branch formed between the second output end of the pre-stage push-pull amplifier circuit 40 and the second input end of the post-stage push-pull amplifier circuit 50. In this embodiment, two LC matching networks are formed between the pre-stage push-pull amplifier circuit 40 and the post-stage push-pull amplifier circuit 50, so that the pre-stage push-pull amplifier circuit can perform first-stage amplification processing on the received RF signal to form two first-stage amplified RF signals. The two first-stage amplified RF signals are respectively subjected to impedance matching through the LC matching network, and then are respectively input into the post-stage push-pull amplifier circuit 50 for second-stage amplification processing to form two second-stage amplified RF signals, and the two LC matching networks formed by the primary matching circuit 10 are used for impedance matching. It is helpful to improve the overall bandwidth between the pre-stage push-pull amplifier circuit 40 and the post-stage push-pull amplifier circuit 50, so as to support signals with wider bands to pass through.

Figure 2:
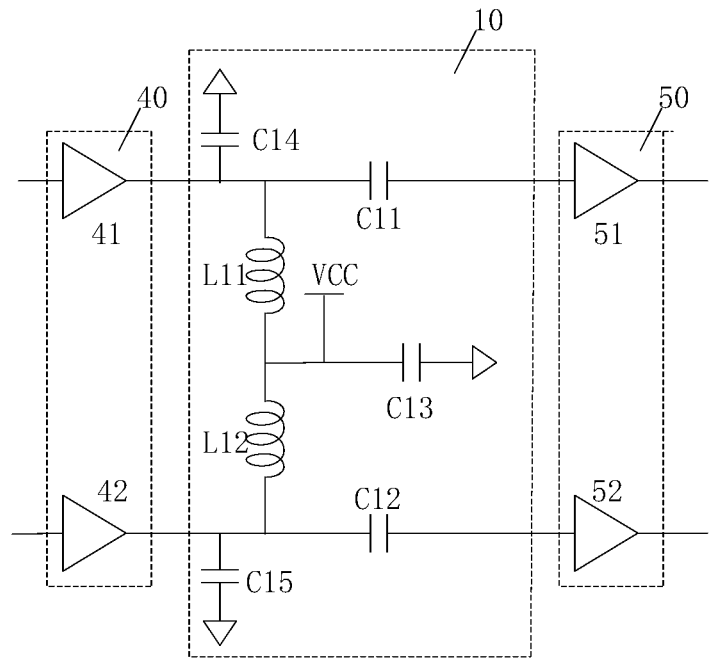
FIG. 2 is another schematic circuit diagram of an interstage matching circuit provided by an embodiment of the present application.

In an embodiment, as shown in FIG. 2, the primary matching circuit 10 further includes a first adjusting capacitor C14 and a second adjusting capacitor C15; one end of the first adjusting capacitor C14 is connected to the connection node between the first output end of the pre-stage push-pull amplifier circuit 40 and the first matching capacitor C11, and the other end is connected to the ground end; one end of the second adjusting capacitor C15 is connected to the connection node between the second output end of the pre-stage push-pull amplifier circuit 40 and the second matching capacitor C12, and the other end is connected to the ground end.

In this embodiment, the connection node between the first output end of the pre-stage push-pull amplifier circuit 40 and the first matching capacitor C11 is connected to the ground end via the first adjusting capacitor C14. The first adjusting capacitor C14 is used to filter the high-frequency noise generated in the process of the feed power supply VCC feeding the pre-stage push-pull amplifier circuit 40 through the first matching inductor L11, so as to ensure the effect of RF signal amplification.

Accordingly, the connection node between the second output end of the pre-stage push-pull amplifier circuit 40 and the second matching capacitor C12 is connected to the ground end via the second adjusting capacitor C15. The second adjusting capacitor C15 is used to filter the high-frequency noise generated in the process of the feed power supply VCC feeding the pre-stage push-pull amplifier circuit 40 through the second matching inductor L12, so as to ensure the effect of RF signal amplification.

In an embodiment, as shown in FIGS. 3-7, the interstage matching circuit further includes a post-matching circuit 20 or a pre-matching circuit 30; the post-matching circuit 20 is arranged between the primary matching circuit 10 and the post-stage push-pull amplifier circuit 50, i.e., the interstage matching circuit includes the primary matching circuit 10 and the post-matching circuit 20; the pre-matching circuit 30 is arranged between the pre-stage push-pull amplifier circuit 40 and the primary matching circuit 10, i.e., the interstage matching circuit includes the pre-matching circuit 30 and the primary matching circuit 10.

Figure 3:
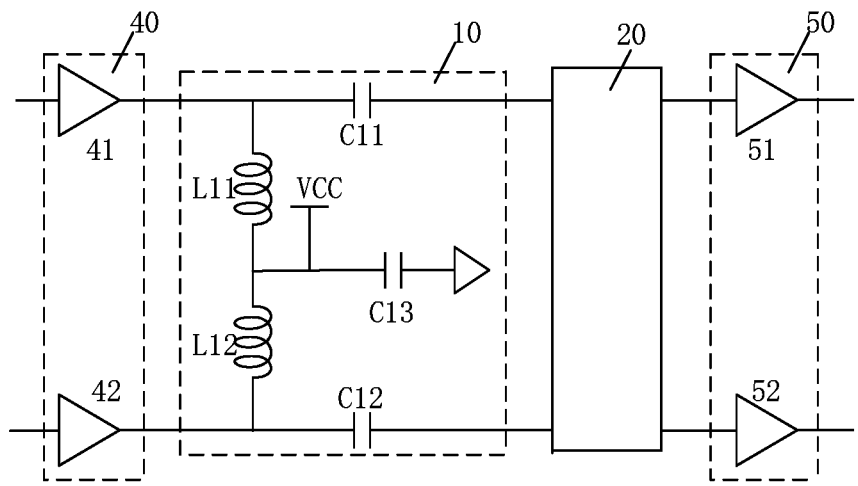
FIG. 3 is another schematic circuit diagram of an interstage matching circuit provided by an embodiment of the present application.

In an embodiment, as shown in FIG. 3, the interstage matching circuit further includes a post-matching circuit 20, the post-matching circuit 20 is arranged between the primary matching circuit 10 and the post-stage push-pull amplifier circuit 50.

When the interstage matching circuit only includes the primary matching circuit 10, the overall bandwidth between the pre-stage push-pull amplifier circuit 40 and the post-stage push-pull amplifier circuit 50 may be increased to some extent to support wider broadband signals to pass through. However, the frequency band of RF signals that the primary matching circuit 10 able to transmit is relatively narrow, which makes the overall bandwidth unable to meet the bandwidth requirements of the push-pull power amplifier circuit. Therefore, the interstage matching circuit between the pre-stage push-pull amplifier circuit 40 and the post-stage push-pull amplifier circuit 50 may be adjusted and optimized, i.e., on the basis of the primary matching circuit 10, a post-matching circuit 20 is provided, and the post-matching circuit 20 is arranged between the primary matching circuit 10 and the post-stage push-pull amplifier circuit 50. The push-pull power amplifier circuit shown in FIG. 3 includes a pre-stage push-pull amplifier circuit 40 and a post-stage push-pull amplifier circuit 50, and further includes a primary matching circuit 10 and a post-matching circuit 20 connected between the pre-stage push-pull amplifier circuit 40 and the post-stage push-pull amplifier circuit 50. The primary matching circuit 10 and post-matching circuit 20 work together to form an interstage matching circuit, used for performing impedance matching for the pre-stage push-pull amplifier circuit 40 and the post-stage push-pull amplifier circuit 50, so as to improve the overall bandwidth of the push-pull power amplifier circuit and enable it to support the transmission of wider-band signals.

Figure 4:
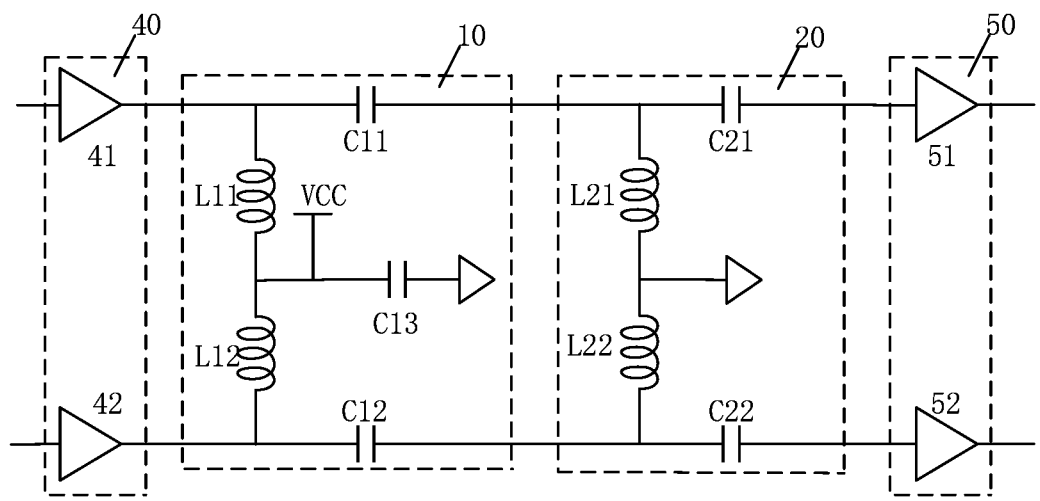
FIG. 4 is another schematic circuit diagram of an interstage matching circuit provided by an embodiment of the present application.

In an embodiment, as shown in FIG. 4, the post-matching circuit 20 includes a third matching capacitor C21, a fourth matching capacitor C22, a third matching inductor L21 and a fourth matching inductor L22. The third matching capacitor C21 is arranged between the first matching capacitor C11 and the first input end of the post-stage push-pull amplifier circuit 50; the fourth matching capacitor C22 is arranged between the second matching capacitor C12 and the second input end of the post-stage push-pull amplifier circuit 50; the first end of the third matching inductor L21 is connected to the connection node between the first matching capacitor C11 and the second matching capacitor C12, the second end of the third matching inductor L21 is connected to the first end of the fourth matching inductor L22, the second end of the fourth matching inductor L22 is connected to the connection node between the second matching capacitor C12 and the fourth matching capacitor C22; and the connection node between the third matching inductor L21 and the fourth matching inductor L22 is connected to the ground end.

The third matching inductor L21 and the third matching capacitor C21 construct an LC matching network, used to perform impedance matching for a first branch formed between the first output end of the pre-stage push-pull amplifier circuit 40 and the first input end of the post-stage push-pull amplifier circuit 50. Accordingly, the fourth matching inductor L22 and the fourth matching capacitor C22 construct an LC matching network, used to perform impedance matching for a second branch formed between the second output end of the pre-stage push-pull amplifier circuit 40 and the second input end of the post-stage push-pull amplifier circuit 50.

As shown in FIG. 4, the primary matching circuit 10 and the post-matching circuit 20 are connected in series to form an interstage matching circuit, and arranged between the pre-stage push-pull amplifier circuit 40 and the post-stage push-pull amplifier circuit 50. Specifically, the first matching capacitor C11 and the third matching capacitor C21 are arranged in series on the first branch formed between the first output end of the pre-stage push-pull amplifier circuit 40 and the first input end of the post-stage push-pull amplifier circuit 50; the second matching capacitor C12 and fourth matching capacitor C22 are arranged in series on the second branch formed between the second output end of pre-stage push-pull amplifier circuit 40 and the second input end of post-stage push-pull amplifier circuit 50; the first matching inductor L11 and the second matching inductor L12 are connected in series, and the first matching inductor L11 is connected with the connection node between the first output end of the pre-stage push-pull amplifier circuit 40 and the first matching capacitor C11; the second matching inductor L12 is connected with the connection node between the second output end of pre-stage push-pull amplifier circuit 40 and the second matching capacitor C12; the third matching inductor L21 and the fourth matching inductor L22 are connected in series, and the third matching inductor L21 is connected with the connection node between the first matching capacitor C11 and the third matching capacitor C21; the fourth matching inductor L22 is connected with the connection node between the second matching capacitor C12 and the fourth matching capacitor C22. Because of the DC blocking property of capacitor, the feed power supply VCC needs to be connected to the connection node between the first matching inductor L11 and second matching inductor L12, so that the feed power supply VCC can feed the pre-stage push-pull amplifier circuit 40 through the first matching inductor L11 and second matching inductor L12, respectively.

Understandably, on the first branch formed between the first output end of the pre-stage push-pull amplifier circuit 40 and the first input end of the post-stage push-pull amplifier circuit 50, an LC matching network is formed by serially connecting the first matching inductor L11 and the first matching capacitor C11, and an LC matching network is formed by the third matching inductor L21 and the third matching capacitor C21. On the second branch formed between the second output end of the pre-stage push-pull amplifier circuit 40 and the second input end of the post-stage push-pull amplifier circuit 50, an LC matching network is formed by serially connecting the second matching inductor L12 and the second matching capacitor C12, and an LC matching network is formed by the fourth matching inductor L22 and the fourth matching capacitor C22. All of the LC matching networks constitute the interstage matching circuit, which provides impedance matching for the pre-stage push-pull amplifier circuit 40 and post-stage push-pull amplifier circuit 50. Compared with the interstage matching circuit formed only by the primary matching circuit 10, it can further increase the overall bandwidth of the push-pull power amplifier circuit, thus it is able to support the transmission of signals with wider bandwidth.

Figure 5:
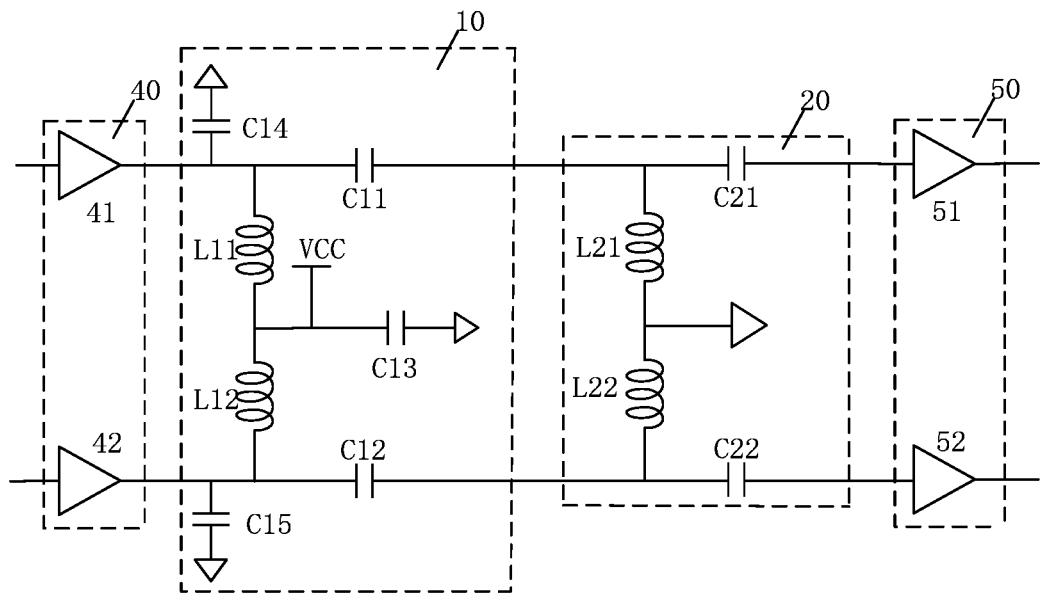
FIG. 5 is another schematic circuit diagram of an interstage matching circuit provided by an embodiment of the present application.

In an embodiment, as shown in FIG. 5, the primary matching circuit 10 further includes a first adjusting capacitor C14 and a second adjusting capacitor C15. One end of the first adjusting capacitor C14 is connected to the connection node between the first output end of the pre-stage push-pull amplifier circuit 40 and the first matching capacitor C11, and the other end is connected to the ground end; one end of the second adjusting capacitor C15 is connected to the connection node between the second output end of the pre-stage push-pull amplifier circuit 40 and the second matching capacitor C12, and the other end is connected to the ground end. The post-matching circuit 20 includes a third matching capacitor C21, a fourth matching capacitor C22, a third matching inductor L21 and a fourth matching inductor L22. The third matching capacitor C21 is arranged between the first matching capacitor C11 and the first input end of the post-stage push-pull amplifier circuit 50; the fourth matching capacitor C22 is arranged between the second matching capacitor C12 and the second input end of the post-stage push-pull amplifier circuit 50; the first end of the third matching inductor L21 is connected to the connection node between the first matching capacitor C11 and the second matching capacitor C12, the second end of the third matching inductor L21 is connected to the first end of the fourth matching inductor L22, the second end of the fourth matching inductor L22 is connected to the connection node between the second matching capacitor C12 and the fourth matching capacitor C22; and the connection node between the third matching inductor L21 and the fourth matching inductor L22 is connected to the ground end.

As shown in FIG. 5, the interstage matching circuit includes the primary matching circuit 10 of FIG. 2 and the post-matching circuit 20 of FIG. 4. The interstage matching circuit formed by the primary matching circuit 10 and post-matching circuit 20 connected in series, provides impedance matching for the pre-stage push-pull amplifier circuit 40 and post-stage push-pull amplifier circuit 50. Compared with the interstage matching circuit formed only by the primary matching circuit 10, it can further increase the overall bandwidth of the push-pull power amplifier circuit, thus it is able to support the transmission of wider broadband signals. In the primary matching circuit 10 of this embodiment, the connection node between the first output end of the pre-stage push-pull amplifier circuit 40 and the first matching capacitor C11 is connected to the ground end via the first adjusting capacitor C14. The first adjusting capacitor C14 is used to filter the high-frequency noise generated in the process of the feed power supply VCC feeding the pre-stage push-pull amplifier circuit 40 through the first matching inductor L11, so as to ensure the effect of RF signal amplification. Accordingly, the connection node between the second output end of the pre-stage push-pull amplifier circuit 40 and the second matching capacitor C12 is connected to the ground end via the second adjusting capacitor C15. The second adjusting capacitor C15 is used to filter the high-frequency noise generated in the process of the feed power supply VCC feeding the pre-stage push-pull amplifier circuit 40 through the second matching inductor L12, so as to ensure the effect of RF signal amplification.

Figure 6:
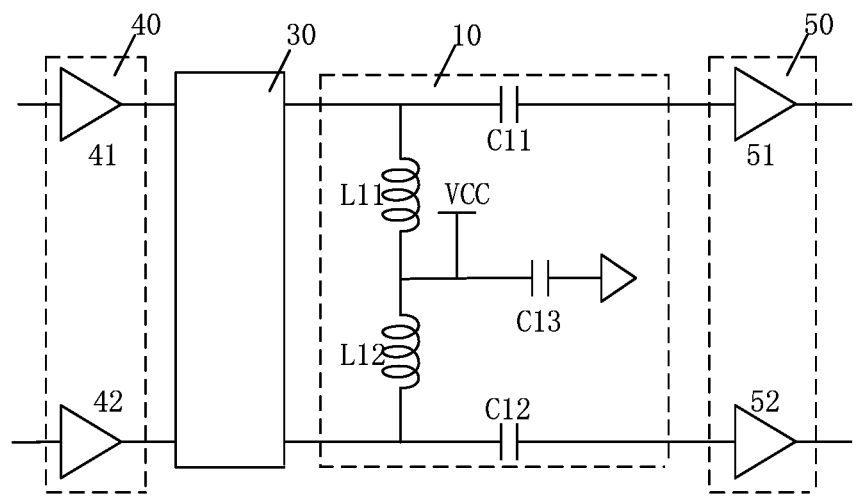
FIG. 6 is another schematic circuit diagram of an interstage matching circuit provided by an embodiment of the present application.

In an embodiment, as shown in FIG. 6, the interstage matching circuit further includes a pre-matching circuit 30, the pre-matching circuit 30 is arranged between the pre-stage push-pull amplifier circuit 40 and the primary matching circuit 10.

When the interstage matching circuit only includes the primary matching circuit 10, the overall bandwidth between the pre-stage push-pull amplifier circuit 40 and the post-stage push-pull amplifier circuit 50 may be increased to some extent to support wider broadband signals to pass through. However, the frequency band of RF signals that the primary matching circuit 10 able to transmit is relatively narrow, which makes the overall bandwidth unable to meet the bandwidth requirements of the push-pull power amplifier circuit. Therefore, the interstage matching circuit between the pre-stage push-pull amplifier circuit 40 and the post-stage push-pull amplifier circuit 10 may be adjusted and optimized, i.e., on the basis of the primary matching circuit 10, a pre-matching circuit 30 is provided, and the pre-matching circuit 30 is arranged between the pre-stage push-pull amplifier circuit 40 and the primary matching circuit 10. As shown in FIG. 6, the push-pull power amplifier circuit includes a pre-stage push-pull amplifier circuit 40 and a post-stage push-pull amplifier circuit 50, and further includes a primary matching circuit 10 and a pre-matching circuit 30 connected between the pre-stage push-pull amplifier circuit 40 and the post-stage push-pull amplifier circuit 50. The primary matching circuit 10 and pre-matching circuit 30 work together to form an interstage matching circuit, used for performing impedance matching for the pre-stage push-pull amplifier circuit 40 and the post-stage push-pull amplifier circuit 50, so as to improve the overall bandwidth of the push-pull power amplifier circuit and enable it to support the transmission of wider-band signals.

Figure 7:
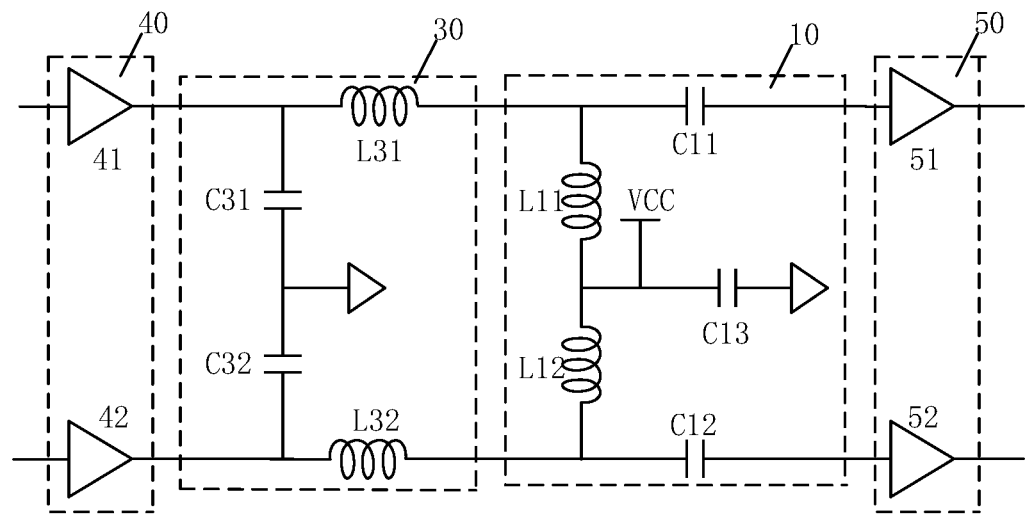
FIG. 7 is another schematic circuit diagram of an interstage matching circuit provided by an embodiment of the present application.

In an embodiment, as shown in FIG. 7, the pre-matching circuit 30 includes a fifth matching inductor L31, a sixth matching inductor L32, a fifth matching capacitor C31 and a sixth matching capacitor C32. The fifth matching inductor L31 is connected with the first output end of the pre-stage push-pull amplifier circuit 40 and the first matching capacitor C11; the sixth matching inductor L32 is connected to the second output end of the pre-stage push-pull amplifier circuit 40 and the second matching capacitor C12. The first end of the fifth matching capacitor C31 is connected to the connection node between the first output end of the pre-stage push-pull amplifier circuit 40 and the fifth matching inductor L31, the second end of the fifth matching capacitor C31 is connected with the first end of the sixth matching capacitor C32, the second end of the sixth matching capacitor C32 is connected with the connection node between the second output end of the pre-stage push-pull amplifier circuit 40 and the sixth matching inductor L32; and the connection node between the fifth matching capacitor C31 and the sixth matching capacitor C32 is connected to the ground end.

The fifth matching inductor L31 and fifth matching capacitor C31 construct an LC matching network, used to perform impedance matching for a first branch formed between the first output end of the pre-stage push-pull amplifier circuit 40 and the first input end of the post-stage push-pull amplifier circuit 50. Accordingly, the sixth matching inductor L32 and sixth matching capacitor C32 construct an LC matching network, used to perform impedance matching for a second branch formed between the second output end of the pre-stage push-pull amplifier circuit 40 and the second input end of the post-stage push-pull amplifier circuit 50.

As shown in FIG. 7, the pre-matching circuit 30 and primary matching circuit 10 are connected in series to form an interstage matching circuit, and arranged between the pre-stage push-pull amplifier circuit 40 and the post-stage push-pull amplifier circuit 50. Specifically, the fifth matching inductor L31 and first matching capacitor C11 are arranged in series on the first branch formed between the first output end of the pre-stage push-pull amplifier circuit 40 and the first input end of the post-stage push-pull amplifier circuit 50; the sixth matching inductor L32 and second matching capacitor C12 are arranged in series on the second branch formed between the second output end of pre-stage push-pull amplifier circuit 40 and the second input end of post-stage push-pull amplifier circuit 50; the fifth matching capacitor C31 and sixth matching capacitor C32 are connected in series, and the fifth matching capacitor C31 is connected with the connection node between the first output end of the pre-stage push-pull amplifier circuit 40 and the fifth matching inductor L31; the sixth matching capacitor C32 is connected with the connection node between the second output end of pre-stage push-pull amplifier circuit 40 and the sixth matching inductor L32; the first matching inductor L11 and second matching inductor L12 are connected in series, and the first matching inductor L11 is connected with the connection node between the fifth matching inductor L31 and the first matching capacitor C11; the second matching inductor L12 is connected with the connection node between the sixth matching inductor L32 and the second matching capacitor C12. The feed power supply VCC is connected to the connection node between the first matching inductor L11 and the second matching inductor L12 via the power connection node, so that the feed power supply VCC can feed the pre-stage push-pull amplifier circuit 40 through first matching inductor L11 and fifth matching inductor L31, and feed the pre-stage push-pull amplifier circuit 40 through the second matching inductor L12 and sixth matching inductor L32.

Understandably, on the first branch formed between the first output end of the pre-stage push-pull amplifier circuit 40 and the first input end of the post-stage push-pull amplifier circuit 50, an LC matching network is formed by serially connecting the fifth matching inductor L31 and fifth matching capacitor C31, and an LC matching network is formed by the first matching inductor L11 and first matching capacitor C11. On the second branch formed between the second output end of the pre-stage push-pull amplifier circuit 40 and the second input end of the post-stage push-pull amplifier circuit 50, an LC matching network is formed by serially connecting the sixth matching inductor L32 and sixth matching capacitor C32, and an LC matching network is formed by the second matching inductor L12 and second matching capacitor C12. All of the LC matching networks constitute the interstage matching circuit, which provides impedance matching for the pre-stage push-pull amplifier circuit 40 and post-stage push-pull amplifier circuit 50. Compared with the interstage matching circuit formed only by the primary matching circuit 10, it can further increase the overall bandwidth of the push-pull power amplifier circuit, thus it is able to support the transmission of signals with wider bandwidth.

In this embodiment, the interstage matching circuit shown in FIG. 7 is formed by connecting the pre-matching circuit 30 and primary matching circuit 10 in series, the interstage matching circuit shown in FIGS. 4 and 5 is formed by connecting the primary matching circuit 10 and post-matching circuit 20 in series. Compared with the two, the interstage matching circuit shown in FIG. 7 has a wider bandwidth, but it occupies a larger area with a larger loss.

In this embodiment, the bandwidth of the interstage matching circuit (i.e., the interstage matching circuit shown in FIG. 7) formed by the pre-matching circuit 30 and primary matching circuit 10, is larger than the bandwidth of the interstage matching circuit (i.e. the interstage matching circuit shown in FIG. 4 or FIG. 5) formed by the primary matching circuit 10 and post-matching circuit 20. In the interstage matching circuit shown in FIG. 7, the fifth matching inductor L31 and first matching capacitor C11 are arranged in series on the first branch formed by the pre-stage push-pull amplifier circuit 40 and post-stage push-pull amplifier circuit 50. And, the sixth matching inductor L32 and second matching capacitor C12 are arranged in series on the second branch formed by the pre-stage push-pull amplifier circuit 40 and post-stage push-pull amplifier circuit 50. In the interstage matching circuit shown in FIGS. 4 and 5, the first matching capacitor C11 and third matching capacitor C21 are arranged in series on the first branch formed by the pre-stage push-pull amplifier circuit 40 and post-stage push-pull amplifier circuit 50. And, the second matching capacitor C12 and fourth matching capacitor C22 are arranged in series on the second branch formed by the pre-stage push-pull amplifier circuit 40 and post-stage push-pull amplifier circuit 50.

In this embodiment, the loss of the interstage matching circuit (i.e. the interstage matching circuit shown in FIG. 7) formed by the pre-matching circuit 30 and primary matching circuit 10, is greater than the loss of the interstage matching circuit (i.e. the interstage matching circuit shown in FIG. 4 or FIG. 5) formed by the primary matching circuit 10 and post-matching circuit 20. Generally, the loss of the series inductor is greater than that of the series capacitor, hence the loss of the interstage matching circuit shown in FIG. 7 is greater than that of the interstage matching circuit shown in FIGS. 4 and 5. Further, for the interstage matching circuit shown in FIG. 7, the feed power supply VCC needs to feed the pre-stage push-pull amplifier circuit 40 on the first branch through the first matching inductor L11 and fifth matching inductor L31, and feed the pre-stage push-pull amplifier circuit 40 on the second branch through the second matching inductor L12 and the sixth matching inductor L32. For the interstage matching circuit shown in FIGS. 4 and 5, the feed power supply VCC needs to feed the pre-stage push-pull amplifier circuit 40 on the first branch through the first matching inductor L11, and feed the pre-stage push-pull amplifier circuit 40 on the second branch through the second matching inductor L12. In the feeding process of feed power supply VCC, the loss of the interstage matching circuit shown in FIG. 7 is greater than that of the interstage matching circuit shown in FIGS. 4 and 5.

In this embodiment, the area of the interstage matching circuit (i.e. the interstage matching circuit shown in FIG. 7) formed by the pre-matching circuit 30 and primary matching circuit 10, is larger than the area of the interstage matching circuit (i.e. the interstage matching circuit shown in FIG. 4 or FIG. 5) formed by the primary matching circuit 10 and post-matching circuit 20. Generally, the inductor with feed power supply VCC needs to have a larger area than the inductor without feed power supply VCC. For the interstage matching circuit shown in FIG. 7, the feed power supply VCC needs to pass through the first matching inductor L11, second matching inductor L12, fifth matching inductor L31 and sixth matching inductor L32. While for the interstage matching circuit shown in FIGS. 4 and 5, the feed power supply VCC needs to pass through the first matching inductor L11 and second matching inductor L12, without passing through the third matching inductor L21 and fourth matching inductor L22. Therefore, the area of the interstage matching circuit shown in FIG. 7 is larger than that of the interstage matching circuit shown in FIGS. 4 and 5.

Figure 8:
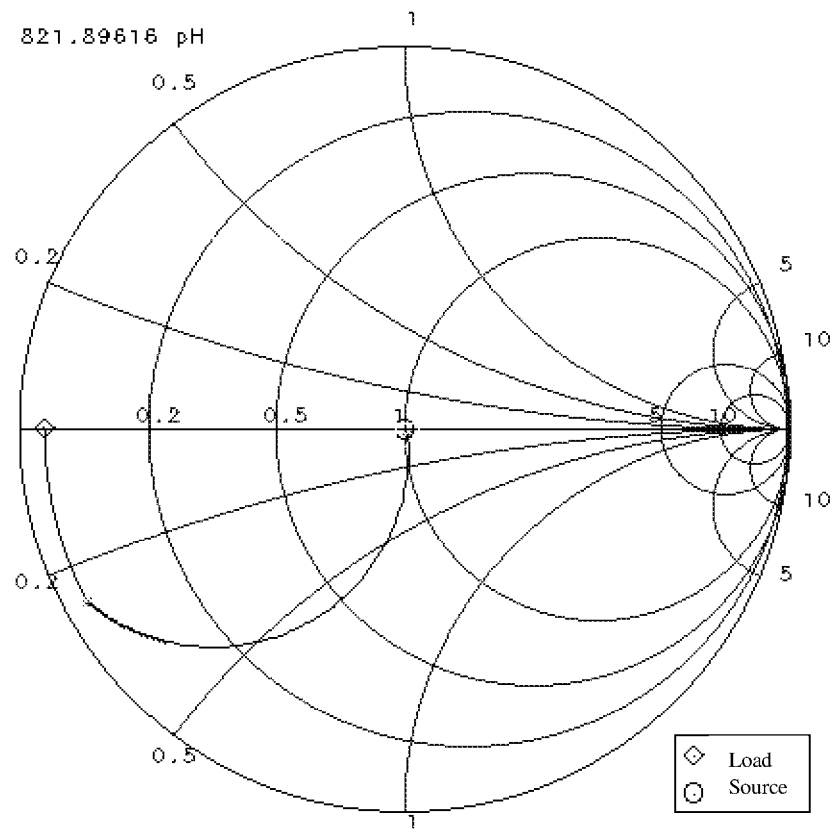
FIG. 8 is a simulation diagram of the interstage matching circuit shown in FIGS. 1-2.
Figure 9:
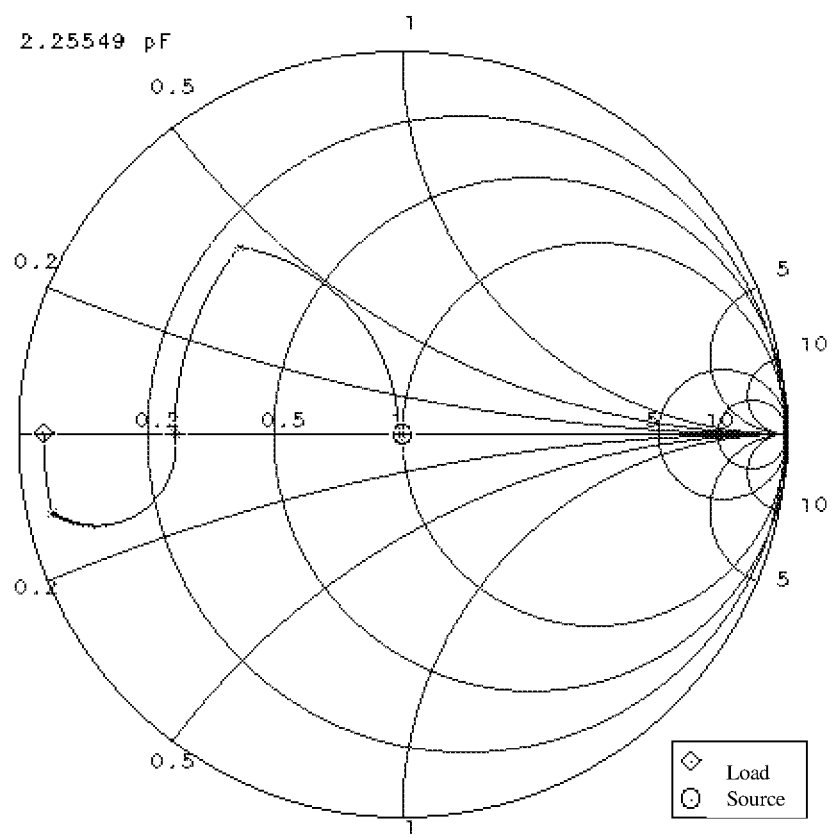
FIG. 9 is a simulation diagram of the interstage matching circuit shown in FIGS. 3-5.
Figure 10:
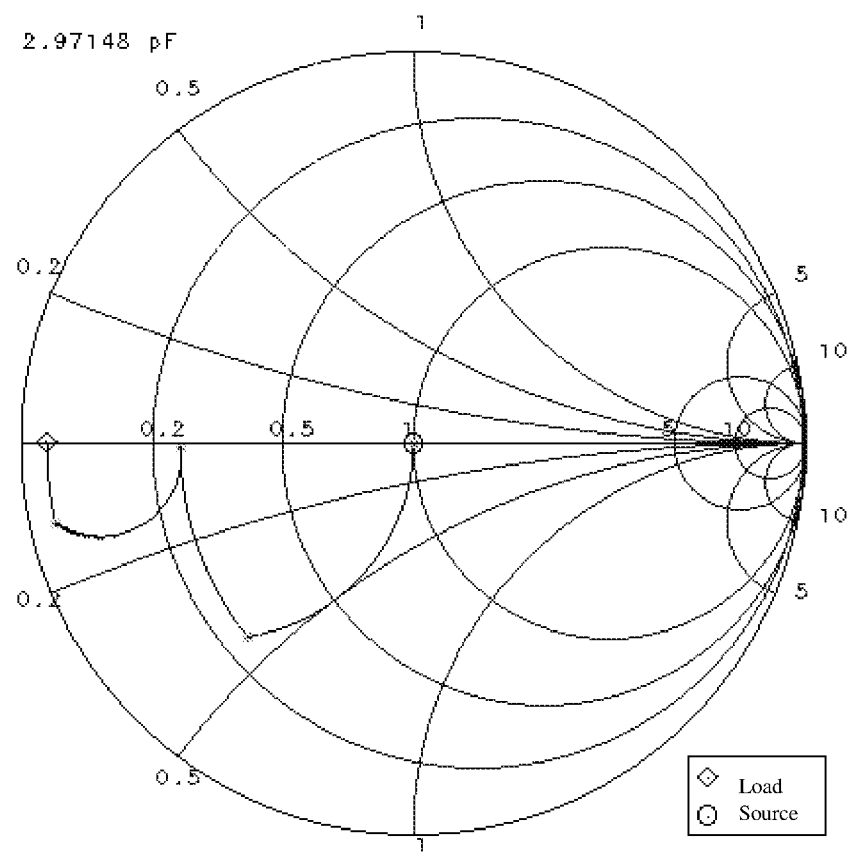
FIG. 10 is a simulation diagram of the interstage matching circuit shown in FIGS. 6-7.
Figure 11:
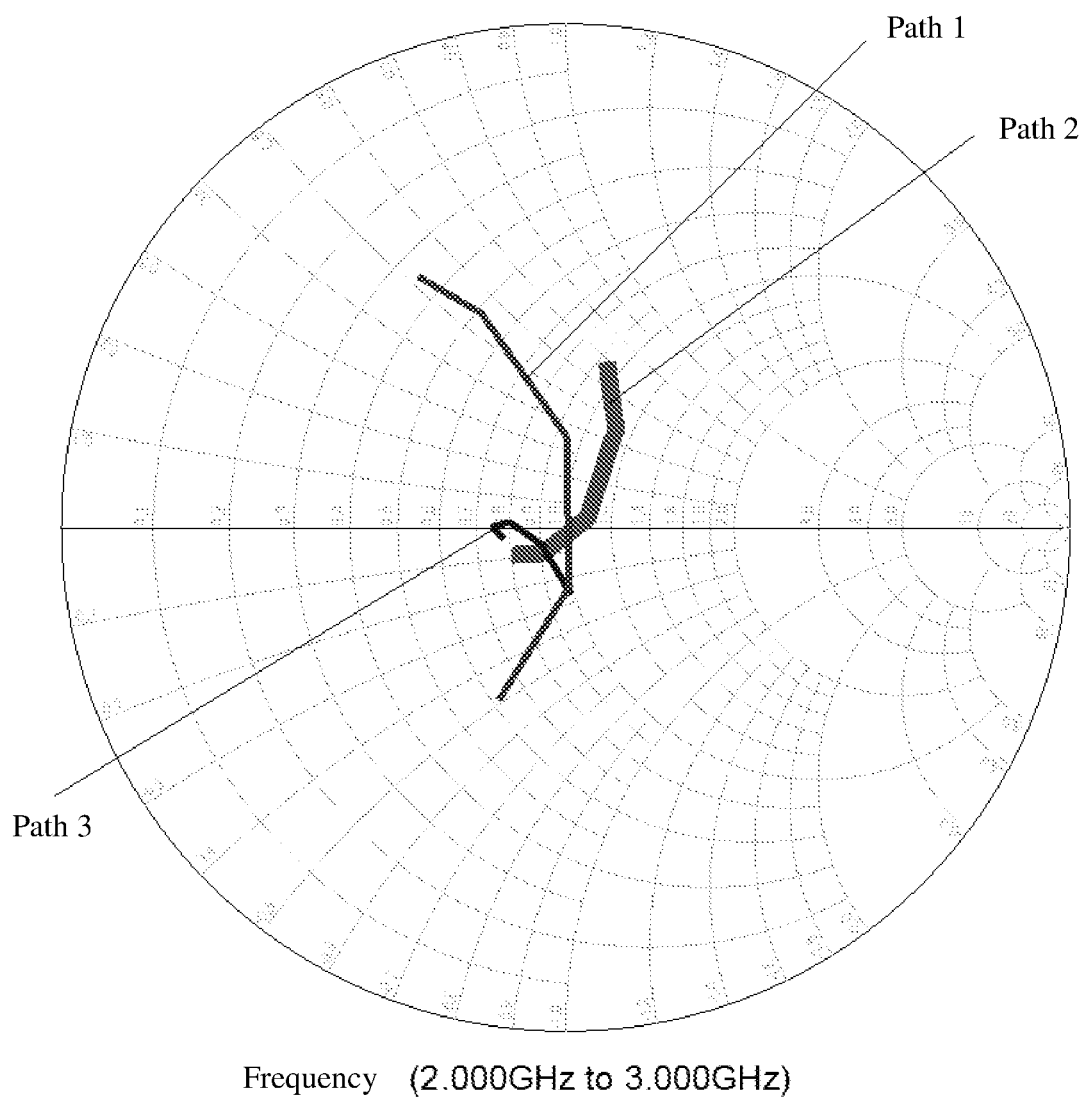
FIG. 11 is a simulation comparison diagram of the interstage matching circuit shown in FIGS. 1-7.

For example, the interstage matching circuits shown in FIGS. 1-7 were tested by simulation, the simulation diagram of impedance matching path of the interstage matching circuit in FIGS. 1-2 is shown in FIG. 8, i.e., Path 1 shown in FIG. 11. The simulation diagram of the impedance matching path of the impedance matching circuit of the interstage matching circuit in FIGS. 3-5 is shown in FIG. 9, i.e., Path 2 shown in FIG. 11. The impedance matching path of the impedance matching circuit of the interstage matching circuit in FIGS. 6-7 is shown in FIG. 10, i.e., Path 3 shown in FIG. 11. The longer the impedance matching path, the smaller its bandwidth. Therefore, when the interstage matching circuit only includes the primary matching circuit 10 shown in FIG. 1-2, its bandwidth is the smallest; when the interstage matching circuit includes the primary matching circuit 10 and post-matching circuit 20 shown in FIG. 3-5, its bandwidth is larger than that of the interstage matching circuit only including the primary matching circuit 10; when the interstage matching circuit includes the pre-matching circuit 30 and primary matching circuit 10 shown in FIGS. 6-7, its bandwidth is the largest, not only larger than that of the interstage matching circuit including the primary matching circuit 10, but also larger than that of the interstage matching circuit formed by the primary matching circuit 10 and post-matching circuit 20.

An embodiment of the present application also provides a push-pull power amplifier circuit, which includes a pre-stage push-pull amplifier circuit 40 and a post-stage push-pull amplifier circuit 50, and further includes the interstage matching circuit provided by the above embodiment. In the above interstage matching circuit, the first matching inductor L11 and the first matching capacitor C11 construct an LC matching network, used for performing impedance matching for a first branch formed between the first output end of the pre-stage push-pull amplifier circuit 40 and the first input end of the post-stage push-pull amplifier circuit 50. Accordingly, the second matching inductor L12 and the second matching capacitor C12 construct another LC matching network, used for performing impedance matching for a second branch formed between the second output end of the pre-stage push-pull amplifier circuit 40 and the second input end of the post-stage push-pull amplifier circuit 50. In this embodiment, two LC matching networks are formed between the pre-stage push-pull amplifier circuit 40 and the post-stage push-pull amplifier circuit 50, so that the pre-stage push-pull amplifier circuit 40 can perform first-stage amplification processing on the received RF signal to form two first-stage amplified RF signals. The two first-stage amplified RF signals are respectively subjected to impedance matching through the LC matching network, and then are respectively input into the post-stage push-pull amplifier circuit 50 for second-stage amplification processing to form two second-stage amplified RF signals, and the two LC matching networks formed by the primary matching circuit 10 are used for impedance matching. It is helpful to improve the overall bandwidth between the pre-stage push-pull amplifier circuit 40 and the post-stage push-pull amplifier circuit 50, so as to support signals with wider bands to pass through.

In an embodiment, the pre-stage push-pull amplifier circuit 40 includes a first pre-amplifier unit 41 and a second pre-amplifier unit 42, the output end of the first pre-amplifier unit 41 is the first output end of the pre-stage push-pull amplifier circuit 40, and the output end of the second pre-amplifier unit 42 is the second output end of the pre-stage push-pull amplifier circuit 40. The post-stage push-pull amplifier circuit 50 includes a first post-amplifier unit 51 and a second post-amplifier unit 52, the input end of the first-stage first post-amplifier unit 51 is the first input end of the post-stage push-pull amplifier circuit 50, and the input end of the second-stage push-pull amplifier unit 52 is the second input end of the post-stage push-pull amplifier circuit 50.

In this embodiment, the pre-stage push-pull amplifier circuit 40 includes a first pre-amplifier unit 41 and a second pre-amplifier unit 42, which can respectively perform first-stage amplification processing on the received RF signals to form two first-stage amplified RF signals. The post-stage push-pull amplifier circuit 50 includes a first post-amplifier unit 51 and a second post-amplifier unit 52, which can respectively perform second-stage amplification processing on the received first-stage amplified RF signals to form two second-stage amplified RF signals. Understandably, the first pre-amplifier unit 41 and first post-amplifier unit 51 form the first branch formed between the first output end of the pre-stage push-pull amplifier circuit 40 and the first input end of the post-stage push-pull amplifier circuit 50; the second pre-amplifier unit 42 and second post-amplifier unit 52 form the second branch formed between the second output end of the pre-stage push-pull amplifier circuit 40 and the second input end of the post-stage push-pull amplifier circuit 50.

As an example, on the first branch formed between the first pre-amplifier unit 41 and first post-amplifier unit 51, an LC matching network formed by the primary matching circuit 10 may be used for impedance matching. On the second branch formed between the second pre-amplifier unit 42 and second post-amplifier unit 52, an LC matching network formed by the primary matching circuit 10 may be used for impedance matching. It is helpful to improve the overall bandwidth between the pre-stage push-pull amplifier circuit 40 and post-stage push-pull amplifier circuit 50, so as to support signals with wider bandwidth to pass through.

As an example, on the first branch formed between the first pre-amplifier unit 41 and first post-amplifier unit 51, two LC matching networks formed by the primary matching circuit 10 and post-matching circuit 20 in series may be used for impedance matching. On the second branch formed between the second pre-amplifier unit 42 and second post-amplifier unit 52, two LC matching networks formed by the primary matching circuit 10 and post-matching circuit 20 in series may be used for impedance matching. Compared with the interstage matching circuit formed only by the primary matching circuit 10, it can further increase the overall bandwidth of the push-pull power amplifier circuit, thus enabling it to support the transmission of signals with wider bandwidth.

As an example, on the first branch formed between the first pre-amplifier unit 41 and first post-amplifier unit 51, two LC matching networks formed by the pre-matching circuit 30 and primary matching circuit 10 in series may be used for impedance matching. On the second branch formed between the second pre-amplifier unit 42 and second post-amplifier unit 52, two LC matching networks formed by the pre-matching circuit 30 and primary matching circuit 10 in series may be used for impedance matching. Compared with the interstage matching circuit formed only by the primary matching circuit 10, it can further increase the overall bandwidth of the push-pull power amplifier circuit, thus enabling it to support the transmission of signals with wider bandwidth.

Figure 12:
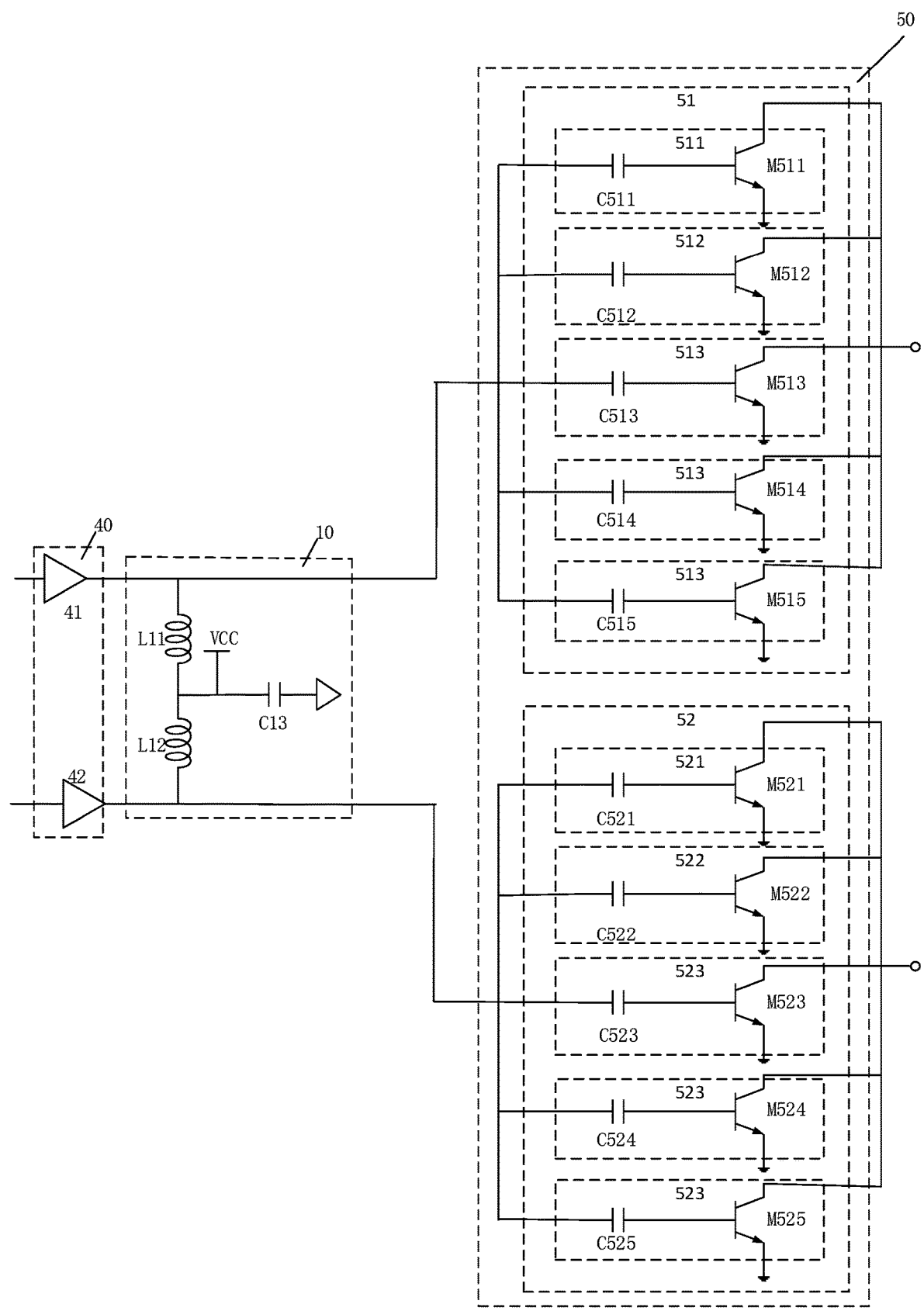
FIG. 12 is a schematic circuit diagram of a push-pull power amplifier circuit provided by an embodiment of the present application.

In an embodiment, a push-pull power amplifier circuit is provided, as shown in FIG. 12, the push-pull power amplifier circuit includes a pre-stage push-pull amplifier circuit 40, post-stage push-pull amplifier circuit 50 and an interstage matching circuit. The interstage matching circuit is configured to provide impedance matching for the push-pull power amplifier circuit. The post-stage push-pull amplifier circuit 50 includes a first post-amplifier unit 51 and a second post-amplifier unit 52. The first post-amplifier unit 51 includes at least two first power amplification units 511/512/513/514/515 connected in parallel between the input node and output node of the first post-amplifier unit 51. The first power amplification unit 511/512/513/514/515 includes a first DC blocking capacitor C511/C512/C513/C514/C515 and a first amplification transistor, and the first DC blocking capacitor C511/C512/C513/C514/C515 is connected between the input node of the first post-amplifier unit 51 and input end of the first amplification transistor. The second post-amplifier unit 52 includes at least two second power amplification units 521/522/523/524/525 connected in parallel between the input node and output node of the second post-amplifier unit 52. The second power amplification unit 521/522/523/524/525 includes a second DC blocking capacitor C521/C522/C523/C524/C525 and a second amplification transistor M521/M522/M523/M524/M525. The second DC blocking capacitor C521/C522/C523/C524/C525 is connected between the input node of the second post-amplifier unit 52 and the input end of the second amplifier transistor M521/M522/M523/M524/M525. The interstage matching circuit includes a primary matching circuit 10 including a first matching inductor L11 and a second matching inductor L12. The first end of the first matching inductor L11 is connected to the input node of the first post-amplifier unit 51, the second end of the first matching inductor L11 is connected to the first end of the second matching inductor L12, the second end of the second matching inductor L12 is connected to the input node of the second post-amplifier unit 52, and the connection node between the first matching inductor L11 and the second matching inductor L12 is used to connect with the feed power supply VCC.

Understandably, after the first matching inductor L11 and first DC blocking capacitor C511/C512/C513/C514/C515 are connected in parallel, the equivalent capacitance constitutes an LC matching network, which is used to provide impedance matching for the first output end of the pre-stage push-pull amplifier circuit 40 and the first post-amplifier unit

51. Accordingly, after the second matching inductor L12 and second DC blocking capacitor C521/C522/C523/C524/C525 are connected in parallel, the equivalent capacitance constitutes another LC matching network, which is used to provide impedance matching for the second output end of the pre-stage push-pull amplifier circuit 40 and the second post-amplifier unit 52.

In this embodiment, two LC matching networks are formed between the pre-stage push-pull amplifier circuit 40 and the post-stage push-pull amplifier circuit 50, so that the pre-stage push-pull amplifier circuit 40 can perform first-stage amplification processing on the received RF signal to form two first-stage amplified RF signals. The two first-stage amplified RF signals are respectively subjected to impedance matching through the LC matching network, and then are respectively input into the first post-stage push-pull amplifier circuit 51 and second post-amplifier unit 52 of the post-stage push-pull amplifier circuit 50 for second-stage amplification processing to form two second-stage amplified RF signals, and the two LC matching networks formed by the primary matching circuit 10 and post-stage push-pull amplifier circuit 5 are used for impedance matching. It is helpful to improve the overall bandwidth between the pre-stage push-pull amplifier circuit 40 and the post-stage push-pull amplifier circuit 50, so as to support signals with wider bands to pass through. In this embodiment, in the post-stage push-pull amplifier circuit 50, after the first DC blocking capacitor C511/C512/C513/C514/C515 (connected between the input node of the first post-amplifier unit 51 and input end of the first amplification transistor) is connected in parallel with the first matching inductor L11, its equivalent capacitance forms an LC matching network, and after the second DC blocking capacitor C521/C522/C523/C524/C525 (connected between the input node of the second post-amplifier unit 52 and the input end of the second amplifier transistor) is connected in parallel with the second matching inductor L12, its equivalent capacitor forms an LC matching network. In this way, impedance matching can be achieved without additionally connecting a matching capacitor matched with the first matching inductor 111/second matching inductor 112 in the primary matching circuit 10 to form an LC matching network.

The first post-amplifier unit 51 includes at least two first power amplification units 511/512/513/514/515 connected in parallel between the input node and output node of the first post-amplifier unit 51, the first power amplification unit 511/512/513/514/515 includes a first DC blocking capacitor C511/C512/C513/C514/C515 and a first amplification transistor M511/M512/M513/M514/M515, and the first DC blocking capacitor C511/C512/C513/C514/C515 is connected between the input node of the first post-amplifier unit 51 and the input end of the first amplification transistor M511/M512/M513/M514/M515, therefore at least two first amplification transistors M511/M512/M513/M514/M515 in the first post-amplifier unit 51 are stacked in sequence, and the input end of each first amplification transistor M511/M512/M513/M514/M515 is provided with a first DC blocking capacitor C511/C512/C513/C514/C515, so as to utilize the equivalent capacitance of the first DC blocking capacitor C511/C512/C513/C514/C515 connected in parallel with the first matching inductor L11 to form an LC matching network, thereby realizing impedance matching.

The second post-amplifier unit 52 includes at least two second power amplification units 521/522/523/524/525 connected in parallel between the input node and output node of the second post-amplifier unit 52, the second power amplification unit 521/522/523/524/525 includes a second DC blocking capacitor C521/C522/C523/C524/C525 and a second amplification transistor M521/M522/M523/M524/M525, and the second DC blocking capacitor C521/C522/C523/C524/C525 is connected between the input node of the second post-amplifier unit 52 and the input end of the second amplification transistor M521/M522/M523/M524/M525, therefore at least two second amplification transistors M521/M522/M523/M524/M525 in the second post-amplifier unit 52 are stacked in sequence, and the input end of each second amplification transistor M521/M522/M523/M524/M525 is provided with a second DC blocking capacitor C521/C522/C523/C524/C525, so as to utilize the equivalent capacitance of the second DC blocking capacitor C521/C522/C523/C524/C525 connected in parallel with the second matching inductor L12 to form an LC matching network, thereby realizing impedance matching.

Figure 13:
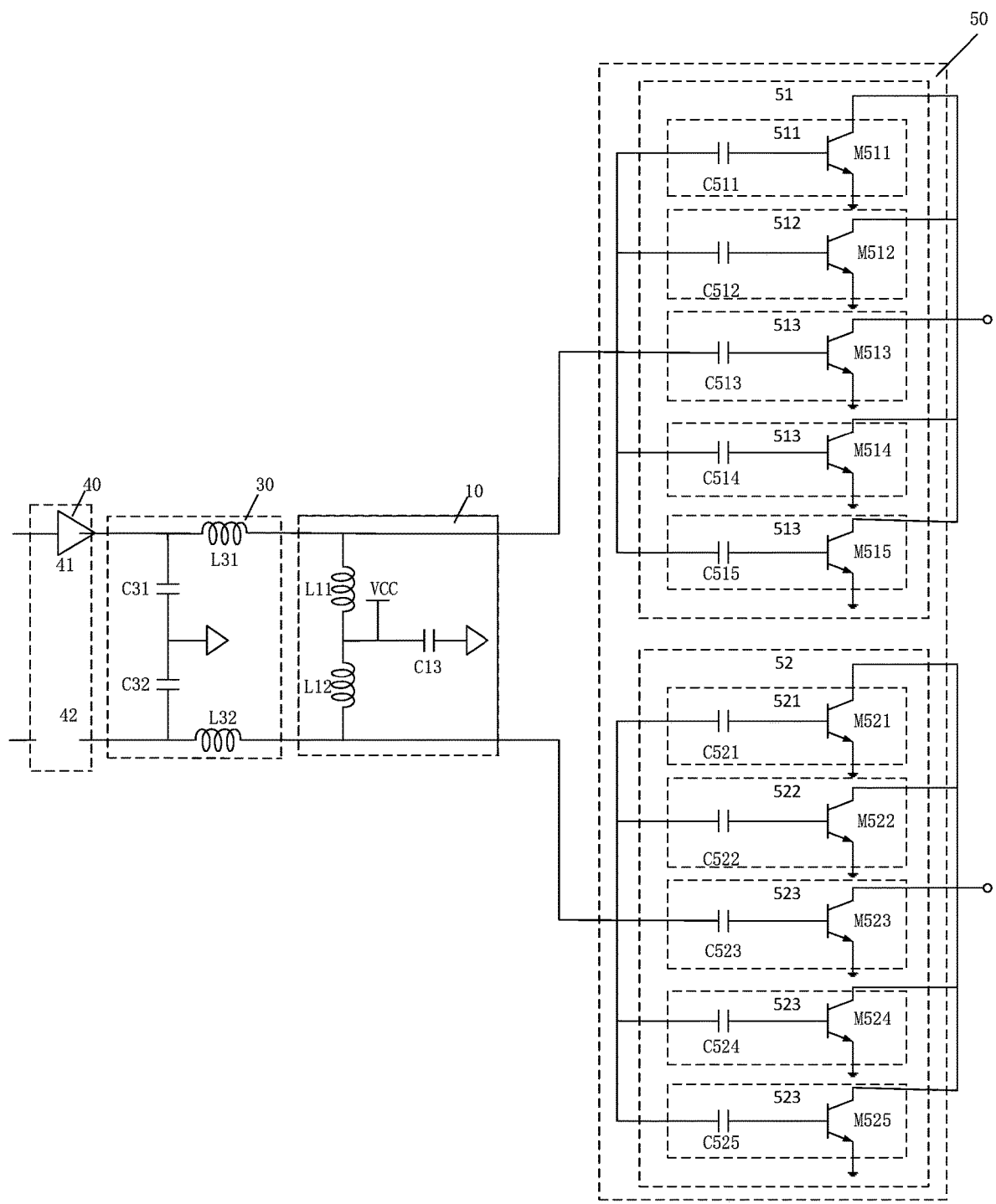
FIG. 13 is a schematic circuit diagram of a push-pull power amplifier circuit provided by an embodiment of the present application.

In an embodiment, as shown in FIG. 13, the interstage matching circuit further includes a pre-matching circuit 30, arranged between the pre-stage push-pull amplifier circuit 40 and primary matching circuit 10. The pre-matching circuit 30 includes a fifth matching inductor L31, a sixth matching inductor L32, a fifth matching capacitor C31 and a sixth matching capacitor C32. The fifth matching inductor L31 is connected between the first output end of the pre-stage push-pull amplifier circuit 40 and the input node of the first post-amplifier unit 51. The sixth matching inductor L32 is connected between the second output end of the pre-stage push-pull amplifier circuit 40 and the input node of the second post-amplifier unit 52. The first end of the fifth matching capacitor C31 is connected to the connection node between the first output end of the pre-stage push-pull amplifier circuit 40 and the fifth matching inductor L31. The second end of the fifth matching capacitor C31 is connected to the first end of the sixth matching capacitor C32, and the second end of the sixth matching capacitor C32 is connected to the connection node between the second output end of the pre-stage push-pull amplifier circuit 40 and the sixth matching inductor L32. And the connection node between the fifth matching capacitor C31 and sixth matching capacitor C32 is connected to the ground end.

In this embodiment, the pre-matching circuit 30 and the primary matching circuit 10 are connected in series to form an interstage matching circuit, and arranged between the pre-stage push-pull amplifier circuit 40 and post-stage push-pull amplifier circuit 50, Specifically, the fifth matching inductor L31 is arranged on the first branch formed between the first output end of the pre-stage push-pull amplifier circuit 40 and the first post-amplifier unit 51. A sixth matching inductor L32 is arranged on the second branch formed between the second output end of the pre-stage push-pull amplifier circuit 40 and second post-amplifier unit 52. The fifth matching capacitor C31 and sixth matching capacitor C32 are connected in series, and the fifth matching capacitor C31 is connected with the connection node between the first output end of the pre-stage push-pull amplifier circuit 40 and the fifth matching inductor L31, the sixth matching capacitor C32 is connected with the connection node between the second output end of the pre-stage push-pull amplifier circuit 40 and the sixth matching inductor L32. The first matching inductor L11 and second matching inductor L12 are connected in series, and the first matching inductor L11 is connected to the connection node between the fifth matching inductor L31 and the first DC blocking capacitor C511/C512/C513/C514/C515 of the first post-amplifier unit 51, the second matching inductor L12 is connected to the connection node between the sixth matching inductor L32 and the second DC blocking capacitor C521/C522/C523/C524/C525 of the second post-amplifier unit 52. The feed power supply VCC is connected to the connection node between the first matching inductor L11 and the second matching inductor L12 via the power connection node, so that the feed power supply VCC can feed the pre-stage push-pull amplifier circuit 40 through first matching inductor L11 and fifth matching inductor L31, and feed the pre-stage push-pull amplifier circuit 40 through the second matching inductor L12 and sixth matching inductor L32.

Understandably, on the first branch formed between the first output end of the pre-stage push-pull amplifier circuit 40 and the first post-amplifier unit 51, the LC matching network formed by the fifth matching inductor L31 and fifth matching capacitor C31, and the LC matching network formed by the first matching inductor L11 and the first DC blocking capacitor C511/C512/C513/C514/C515 of the first post-amplifier unit 51, are connected in series. On the second branch formed between the second output end of the pre-stage push-pull amplifier circuit 40 and the second post-amplifier unit 52, the LC matching network formed by the sixth matching inductor L32 and sixth matching capacitor C32, and the LC matching network formed by the second matching inductor L12 and the second DC blocking capacitor C521/C522/C523/C524/C525 of the second post-amplifier unit 52 are connected in series. All of the LC matching networks form an interstage matching circuit to provide impedance matching for the pre-stage push-pull amplifier circuit 40 and post-stage push-pull amplifier circuit 50. Without additionally connecting a matching capacitor matched with the first matching inductor Li i/second matching inductor L12 in the primary matching circuit 10 to form an LC matching network, impedance matching can be realized. Thereby improving the overall bandwidth of the push-pull power amplifier circuit, and enabling it to support the transmission of wider-band signals.

Figure 14:
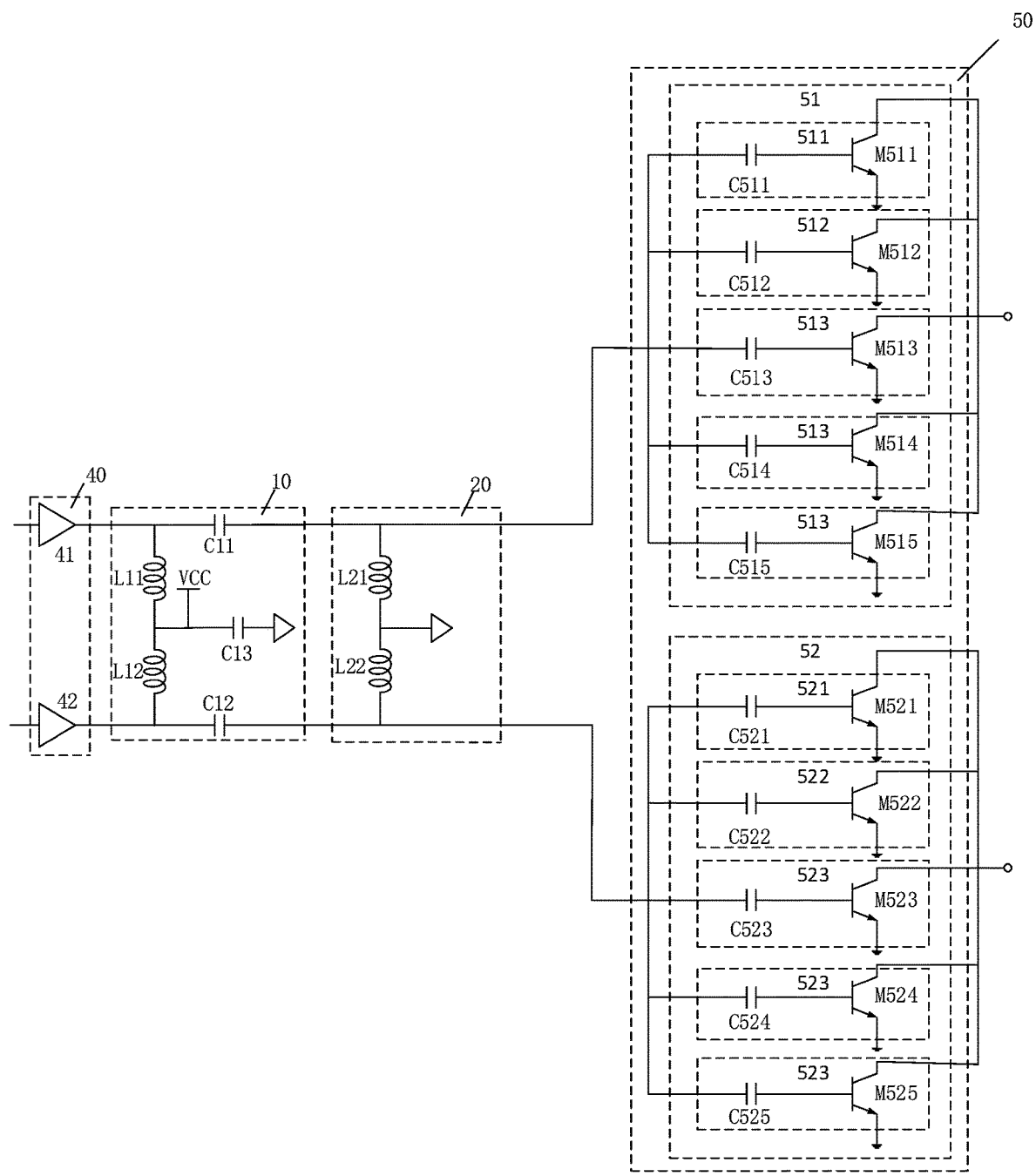
FIG. 14 is a schematic circuit diagram of a push-pull power amplifier circuit provided by an embodiment of the present application.

In an embodiment, as shown in FIG. 14, a push-pull power amplifier circuit includes a pre-stage push-pull amplifier circuit 40, a post-stage push-pull amplifier circuit 50 and an interstage matching circuit, the interstage matching circuit is configured to provide impedance matching for the push-pull power amplifier circuit. The post-stage push-pull amplifier circuit 50 includes a first post-amplifier unit 51 and a second post-amplifier unit 52. The first post-amplifier unit 51 includes at least two first power amplification units 511/512/513/514/515 connected in parallel between the input node and output node of the first post-amplifier unit 51. The first power amplification unit 511/512/513/514/515 includes a first DC blocking capacitor C511/C512/C513/C514/C515 and a first amplification transistor M511/M512/M513/M514/M515. The first DC blocking capacitor C511/C512/C513/C514/C515 is connected between the input node of the first post-amplifier unit 51 and the input end of the first amplification transistor M511/M512/M513/M514/M515. The second post-amplifier unit 52 includes at least two second power amplification units 521/522/523/524/525 connected in parallel between the input node and output node of the second post-amplifier unit 52. The second power amplification unit 521/522/523/524/525 includes a second DC blocking capacitor C521/C522/C523/C524/C525 and a second amplification transistor M521/M522/M523/M524/M525. The second DC blocking capacitor C521/C522/C523/C524/C525 is connected between the input node of the second post-amplifier unit 52 and the input end of the second amplification transistor M521/M522/M523/M524/M525. The interstage matching circuit includes a primary matching circuit 10 and a post-matching circuit 20, and the post-matching circuit 20 is arranged between the primary matching circuit 10 and the post-stage push-pull amplifier circuit 50. The primary matching circuit 10 includes a first matching capacitor C11, a second matching capacitor C12, a first matching inductor L11 and a second matching inductor L12. The first matching capacitor C11 is connected in series between the first output end of the pre-stage push-pull amplifier circuit 40 and the first input end of the post-stage push-pull amplifier circuit 50. The second matching capacitor C12 is connected in series between the second output end of the pre-stage push-pull amplifier circuit 40 and the second input end of the post-stage push-pull amplifier circuit 50. The first end of the first matching inductor L11 is connected to the connection node between the first output end of the pre-stage push-pull amplifier circuit 40 and the first matching capacitor C11, the second end of the first matching inductor L11 is connected with the first end of the second matching inductor L12, the second end of the second matching inductor L12 is connected to the connection node between the second output end of the pre-stage push-pull amplifier circuit 40 and the second matching capacitor C12, and the connection node between the first matching inductor L11 and the second matching inductor L12 is used to connect with the feed power supply VCC. The post-matching circuit 20 includes a third matching inductor L21 and a fourth matching inductor L22. The first end of the third matching inductor L21 is connected to the connection node between the first matching capacitor C11 and the input node of the first post-amplifier unit 51, the second end of the third matching inductor L21 is connected to the first end of the fourth matching inductor L22, and the second end of the fourth matching inductor L22 is connected to the connection node between the second matching capacitor C12 and the input node of the second post-amplifier unit 52. The connection node between the third matching inductor L21 and the fourth matching inductor L22 is connected to the ground end.

In this embodiment, the primary matching circuit 10 and the post-matching circuit 20 are connected in series to form an interstage matching circuit, and arranged between the pre-stage push-pull amplifier circuit 40 and the post-stage push-pull amplifier circuit 50. Specifically, the first matching capacitor C11 is arranged on the first branch formed between the first output end of the pre-stage push-pull amplifier circuit 40 and the first input end of the post-stage push-pull amplifier circuit 50; the second matching capacitor C12 is arranged on the second branch formed between the second output end of pre-stage push-pull amplifier circuit 40 and the second input end of post-stage push-pull amplifier circuit 50; the first matching inductor L11 and the second matching inductor L12 are connected in series, and the first matching inductor L11 is connected with the connection node between the first output end of the pre-stage push-pull amplifier circuit 40 and the first matching capacitor C11; the second matching inductor L12 is connected with the connection node between the second output end of pre-stage push-pull amplifier circuit 40 and the second matching capacitor C12; the third matching inductor L21 is connected with the connection node between the first matching capacitor C11 and the first DC blocking capacitor C511/C512/C513/C514/C515 of the first post-amplifier unit 51; the fourth matching inductor L22 is connected with the connection node between the second matching capacitor C12 and the second DC blocking capacitor C521/C522/C523/C524/C525 of the second post-amplifier unit 52. Because of the DC blocking property of capacitor, the feed power supply VCC needs to be connected to the connection node between the first matching inductor L11 and second matching inductor L12, so that the feed power supply VCC can feed the pre-stage push-pull amplifier circuit 40 through the first matching inductor L11 and second matching inductor L12, respectively.

Understandably, on the first branch formed between the first output end of the pre-stage push-pull amplifier circuit 40 and the first input end of the post-stage push-pull amplifier circuit 50, the LC matching network formed by first matching inductor L11 and first matching capacitor C11 is connected in series with the LC matching network formed by the third matching inductor L21 and the first DC blocking capacitor C511/C512/C513/C514/C515 of the first post-amplifier unit 51. On the second branch formed between the second output end of the pre-stage push-pull amplifier circuit 40 and the second input end of the post-stage push-pull amplifier circuit 50, the LC matching network formed by the second matching inductor L12 and second matching capacitor C12 is connected in series with the LC matching network formed by the fourth matching inductor L22 and the second DC blocking capacitor C521/C522/C523/C524/C525 of the second post-amplifier unit 52. All of the LC matching networks form an interstage matching circuit to provide impedance matching for the pre-stage push-pull amplifier circuit 40 and post-stage push-pull amplifier circuit 50. Without additionally connecting a matching capacitor matched with the third matching inductor L21/fourth matching inductor L22 in the post-matching circuit 20 to form an LC matching network, impedance matching can be realized. Thereby improving the overall bandwidth of the push-pull power amplifier circuit, and enabling it to support the transmission of wider-band signals.

The above embodiments are only used to illustrate the technical solution of the present application, rather than limit it. Although the application has been described in detail with reference to the foregoing embodiments, it should be understood by those skilled in the art that it is still possible to modify the technical solutions described in the foregoing embodiments, or equivalently replace some technical features thereof. These modifications and equivalents do not make the nature of the corresponding technical solution deviates from the spirit and scope of the present application, and shall be included in the protection scope of the present application.

What is claimed is:

1. A push-pull power amplifier circuit, comprising an interstage matching circuit, configured to perform impedance matching for the push-pull power amplifier circuit, the push-pull power amplifier circuit comprises a pre-stage push-pull amplifier circuit and a post-stage push-pull amplifier circuit; characterized in that the interstage matching circuit comprises a primary matching circuit, the primary matching circuit comprises a first matching capacitor, a second matching capacitor, a first matching inductor and a second matching inductor;
   the first matching capacitor is connected in series between a first output end of the pre-stage push-pull amplifier circuit and a first input end of the post-stage push-pull amplifier circuit;
   the second matching capacitor is connected in series between a second output end of the pre-stage push-pull amplifier circuit and a second input end of the post-stage push-pull amplifier circuit;
   a first end of the first matching inductor is connected with a connection node between the first output end of the pre-stage push-pull amplifier circuit and the first matching capacitor, a second end of the first matching inductor is connected with a first end of the second matching inductor, a second end of the second matching inductor is connected with a connection node between the second output end of the pre-stage push-pull amplifier circuit and the second matching capacitor, and a connection node between the first matching inductor and the second matching inductor is used for connecting with a feed power supply;
   wherein the interstage matching circuit further comprises either a pre-matching circuit or a post-matching circuit;
   the pre-matching circuit is arranged between the pre-stage push-pull amplifier circuit and the primary matching circuit; and
   the post-matching circuit is arranged between the primary matching circuit and the post-stage push-pull amplifier circuit.

2. The push-pull power amplifier circuit of claim 1, wherein the primary matching circuit is further provided with a decoupling capacitor, one end of the decoupling capacitor is connected to the connection node between the first matching inductor and the second matching inductor, and another end is connected to a ground end.

3. The push-pull power amplifier circuit of claim 1, wherein the primary matching circuit further comprises a first adjusting capacitor and a second adjusting capacitor;
   one end of the first adjusting capacitor is connected with the connection node between the first output end of the pre-stage push-pull amplifier circuit and the first matching capacitor, and another end is connected to the ground end; and
   one end of the second adjusting capacitor is connected with the connection node between the second output end of the pre-stage push-pull amplifier circuit and the second matching capacitor, and another end is connected to the ground end.

4. The push-pull power amplifier circuit of claim 1, wherein the pre-matching circuit comprises a fifth matching inductor, a sixth matching inductor, a fifth matching capacitor and a sixth matching capacitor;
   the fifth matching inductor is connected with the first output end of the pre-stage push-pull amplifier circuit and the first matching capacitor;
   the sixth matching inductor is connected with the second output end of the pre-stage push-pull amplifier circuit and the second matching capacitor;
   a first end of the fifth matching capacitor is connected with a connection node between the first output end of the pre-stage push-pull amplifier circuit and the fifth matching capacitor, a second end of the fifth matching capacitor is connected with a first end of the sixth matching capacitor, a second end of the sixth matching capacitor is connected with a connection node between the second output end of the pre-stage push-pull amplifier circuit and the sixth matching capacitor; and
   a connection node between the fifth matching capacitor and the sixth matching capacitor is connected with the ground end.

5. The push-pull power amplifier circuit of claim 1, wherein the post-matching circuit comprises a third matching capacitor, a fourth matching capacitor, a third matching inductor and a fourth matching inductor;
   the third matching capacitor is arranged between the first matching capacitor and the first input end of the post-stage push-pull amplifier circuit;
   the fourth matching capacitor is arranged between the second matching capacitor and the second input end of the post-stage push-pull amplifier circuit;

a first end of the third matching inductor is connected with a connection node between the first matching capacitor and the second matching capacitor, a second end of the third matching inductor is connected with a first end of the fourth matching inductor, and a second end of the fourth matching inductor is connected with a connection node between the second matching capacitor and the fourth matching capacitor; and a connection node between the third matching inductor and the fourth matching inductor is connected with the ground end.

6. The push-pull power amplifier circuit of claim 1, wherein an area of the interstage matching circuit formed by combination of the pre-matching circuit and the primary matching circuit, is larger than an area of the interstage matching circuit formed by combination of the primary matching circuit and the post-matching circuit.

7. The push-pull power amplifier circuit of claim 1, wherein the primary matching circuit is further provided with a decoupling capacitor, one end of the decoupling capacitor is connected to the connection node between the first matching inductor and the second matching inductor, and another end is connected to a ground end.

8. The push-pull power amplifier circuit of claim 6, wherein the pre-stage push-pull amplifier circuit comprises a first pre-amplifier unit and a second pre-amplifier unit, an output end of the first pre-amplifier unit is the first output end of the pre-stage push-pull amplifier circuit, and an output end of the second pre-amplifier unit is the second output end of the pre-stage push-pull amplifier circuit; and the post-stage push-pull amplifier circuit comprises a first post-amplifier unit and a second post-amplifier unit, an input end of the first post-amplifier unit is the first input end of the post-stage push-pull amplifier circuit, and an input end of the second post-amplifier unit is the second input end of the post-stage push-pull amplifier circuit.

9. The push-pull power amplifier circuit of claim 8, wherein the first pre-amplifier unit, the second pre-amplifier unit, the first post-amplifier unit and the second post-amplifier unit are power amplification units; and the power amplification unit comprises at least two amplification transistors parallel in sequence; a first end of the amplification transistor is connected with an input end of the power amplification unit, a second end of the amplification transistor is connected with an output end of the power amplification unit, and a third end of the amplification transistor is connected with the ground end.

10. A push-pull power amplifier circuit, comprising a pre-stage push-pull amplifier circuit, a post-stage push-pull amplifier circuit and an interstage matching circuit, the interstage matching circuit is configured to perform impedance matching for the push-pull power amplifier circuit;

the post-stage push-pull amplifier circuit comprises a first post-amplifier unit and a second post-amplifier unit;

the first post-amplifier unit comprises at least two first power amplification units connected in parallel between an input node and an output node of the first post-amplifier unit; the first power amplification unit comprises a first DC blocking capacitor and a first amplification transistor, the first DC blocking capacitor is connected between the input node of the first post-amplifier unit and an input end of the first amplification transistor;

the second post-amplifier unit comprises at least two second power amplification units connected in parallel between an input node and an output node of the second post-amplifier unit;

the second power amplification unit comprises a second DC blocking capacitor and a second amplification transistor, the second DC blocking capacitor is connected between the input node of the second post-amplifier unit and an input end of the second amplification transistor;

the interstage matching circuit comprises a primary matching circuit, the primary matching circuit comprises a first matching inductor and a second matching inductor;

a first end of the first matching inductor is connected with the input node of the first post-amplifier unit, a second end of the first matching inductor is connected with the first end of the second matching inductor, a second end of the second matching inductor is connected with the input node of the second post-amplifier unit, and a connection node between the first matching inductor and the second matching inductor is used for connecting with a feed power supply;

wherein the interstage matching circuit further comprises either a pre-matching circuit or a post-matching circuit;

the pre-matching circuit is arranged between the pre-stage push-pull amplifier circuit and the primary matching circuit; and the post-matching circuit is arranged between the primary matching circuit and the post-stage push-pull amplifier circuit.

11. The push-pull power amplifier circuit of claim 10, wherein the pre-matching circuit comprises a fifth matching inductor, a sixth matching inductor, a fifth matching capacitor and a sixth matching capacitor;

the fifth matching inductor is connected between a first output end of the pre-stage push-pull amplifier circuit and the input node of the first post-amplifier unit;

the sixth matching inductor is connected between a second output end of the pre-stage push-pull amplifier circuit and the input node of the second post-amplifier unit;

a first end of the fifth matching capacitor is connected with a connection node between the first output end of the pre-stage push-pull amplifier circuit and the fifth matching capacitor, a second end of the fifth matching capacitor is connected with a first end of the sixth matching capacitor, a second end of the sixth matching capacitor is connected with a connection node between the second output end of the pre-stage push-pull amplifier circuit and the sixth matching capacitor; and a connection node between the fifth matching capacitor and the sixth matching capacitor is connected with a ground end.

12. A push-pull power amplifier circuit, comprising a pre-stage push-pull amplifier circuit, a post-stage push-pull amplifier circuit and an interstage matching circuit, the interstage matching circuit is configured to perform impedance matching for the push-pull power amplifier circuit;

the post-stage push-pull amplifier circuit comprises a first post-amplifier unit and a second post-amplifier unit, the first post-amplifier unit comprises at least two first power amplification units connected in parallel between an input node and an output node of the first post-amplifier unit; the first power amplification unit comprises a first DC blocking capacitor and a first amplification transistor, the first DC blocking capacitor is connected between the input node of the first post-amplifier unit and an input end of the first amplification transistor;

the second post-amplifier unit comprises at least two second power amplification units connected in parallel between an input node and an output node of the second post-amplifier unit; the second power amplification unit comprises a second DC blocking capacitor and a second amplification transistor, the second DC blocking capacitor is connected between the input node of the second post-amplifier unit and an input end of the second amplification transistor;

the interstage matching circuit comprises a primary matching circuit;

the primary matching circuit comprises a first matching capacitor, a second matching capacitor, a first matching inductor and a second matching inductor;

the first matching capacitor is connected in series between a first output end of the pre-stage push-pull amplifier circuit and a first input end of the post-stage push-pull amplifier circuit;

the second matching capacitor is connected in series between a second output end of the pre-stage push-pull amplifier circuit and a second input end of the post-stage push-pull amplifier circuit;

a first end of the first matching inductor is connected with a connection node between the first output end of the pre-stage push-pull amplifier circuit and the first matching capacitor, a second end of the first matching inductor is connected with a first end of the second matching inductor, a second end of the second matching inductor is connected with a connection node between the second output end of the pre-stage push-pull amplifier circuit and the second matching capacitor, and a connection node between the first matching inductor and the second matching inductor is used for connecting with a feed power supply;

wherein the interstage matching circuit further comprises either a pre-matching circuit or a post-matching circuit;

the pre-matching circuit is arranged between the pre-stage push-pull amplifier circuit and the primary matching circuit;

the post-matching circuit is arranged between the primary matching circuit and the post-stage push-pull amplifier circuit;

the post-matching circuit further comprises a third matching inductor and a fourth matching inductor;

a first end of the third matching inductor is connected with a connection node between the first matching capacitor and the input node of the first post-amplifier unit, a second end of the third matching inductor is connected with a first end of the fourth matching inductor, and a second end of the fourth matching inductor is connected with a connection node between the second matching capacitor and the input node of the second post-amplifier unit; and a connection node between the third matching inductor and the fourth matching inductor is connected with a ground end.

* * * * *